(12) United States Patent
Chen

(10) Patent No.: US 12,426,150 B2
(45) Date of Patent: Sep. 23, 2025

(54) POWER MODULE

(71) Applicant: INDUSTRIAL TECHNOLOGY RESEARCH INSTITUTE, Hsinchu (TW)

(72) Inventor: Wen-Chih Chen, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 254 days.

(21) Appl. No.: 18/136,304

(22) Filed: Apr. 18, 2023

(65) Prior Publication Data

US 2024/0074033 A1 Feb. 29, 2024

Related U.S. Application Data

(60) Provisional application No. 63/402,842, filed on Aug. 31, 2022.

(30) Foreign Application Priority Data

Dec. 23, 2022 (TW) .................................. 111149735

(51) Int. Cl.
*H05K 1/02* (2006.01)

(52) U.S. Cl.
CPC .................................. *H05K 1/0216* (2013.01)

(58) Field of Classification Search
CPC ......... H05K 1/02; H05K 1/0215–0216; H05K 9/00; H01L 23/498; H01L 23/49833; H01L 23/3121; H01L 23/3142; H01L 23/34; H01L 23/373; H01L 23/3735; H01L 23/562; H01L 23/564

USPC .................................. 361/770–790, 816, 818
See application file for complete search history.

(56) References Cited

U.S. PATENT DOCUMENTS

| 5,294,826 A | 3/1994 | Marcantonio et al. |
| 5,519,252 A * | 5/1996 | Soyano .................. H01L 21/56 361/728 |
| 5,942,797 A * | 8/1999 | Terasawa .............. H01L 25/162 257/729 |

(Continued)

FOREIGN PATENT DOCUMENTS

| CN | 203761758 U | 8/2014 |
| CN | 110944277 A | 3/2020 |

(Continued)

OTHER PUBLICATIONS

TW Office Action dated Aug. 16, 2023 as received in Application No. 111149735.

Primary Examiner — Tuan T Dinh
(74) Attorney, Agent, or Firm — Maschoff Brennan

(57) ABSTRACT

A power module includes a power circuit board, a signal pin, a shielding substrate, and an electrically insulating component. The signal pin is disposed and stands on the power circuit board. The shielding substrate is located above the power circuit board and spaced apart from the power circuit board. The shielding substrate has a first through hole. The signal pin is disposed through the first through hole. The electrically insulating component surrounds the signal pin. The electrically insulating component has a second through hole. The signal pin is disposed through the second through hole. The signal pin is spaced apart from the shielding substrate by a distance by the electrically insulating component.

11 Claims, 19 Drawing Sheets

(56) References Cited

U.S. PATENT DOCUMENTS

| | | | |
|---|---|---|---|
| 6,421,244 B1* | 7/2002 | Shinohara | H01L 23/24 |
| | | | 361/783 |
| 7,791,177 B2 | 9/2010 | Kessler et al. | |
| 8,169,784 B2* | 5/2012 | Sakamoto | H01L 25/162 |
| | | | 361/784 |
| 9,107,331 B2* | 8/2015 | Lo Presti | H05K 7/1432 |
| 9,961,772 B2 | 5/2018 | Feng et al. | |
| 10,242,969 B2* | 3/2019 | Hohlfeld | H01L 25/50 |
| 10,497,650 B2 | 12/2019 | Kim et al. | |
| 11,136,237 B2 | 10/2021 | Simbuerger et al. | |
| 11,201,602 B1 | 12/2021 | Oran et al. | |
| 11,315,859 B1 | 4/2022 | Yang et al. | |
| 2012/0038033 A1 | 2/2012 | Oga et al. | |
| 2015/0243640 A1* | 8/2015 | Horio | H01L 25/074 |
| | | | 257/701 |
| 2022/0201841 A1 | 6/2022 | Liu et al. | |
| 2022/0208666 A1 | 6/2022 | Yang et al. | |

FOREIGN PATENT DOCUMENTS

| | | |
|---|---|---|
| JP | 2005-353713 A | 12/2005 |
| TW | M540449 U | 4/2017 |
| WO | 2012011210 A1 | 1/2012 |

* cited by examiner

POWER MODULE

This non-provisional application claims priority under 35 U.S.C. § 119(a) on U.S. Provisional Application 63/402,842 filed on Aug. 31, 2022 and Patent Application No(s). 111149735 filed in Taiwan, R.O.C. on Dec. 23, 2022, the entire contents of which are hereby incorporated by reference.

TECHNICAL FIELD

The disclosure relates to a power module.

BACKGROUND

Electromagnetic interference (EMI) refers to any electromagnetic phenomenon which may cause the performance of devices, apparatuses or systems to degrade, or cause damage to living things or non-living things. Electromagnetic interference may be electromagnetic noise, unwanted signals, or changes in the transmission medium itself.

In the field of power modules, high-power electrical signals are usually processed. In the process of processing electrical signals, there would be electromagnetic waves emitted to the surrounding environment. In addition, various electromagnetic waves are present everywhere in our environment nowadays.

Therefore, in this technical field, it is necessary to develop a power module which could prevent a system control circuit connected to the power module from being interfered by environmental electromagnetic waves, and could shield and reduce the impact of electromagnetic waves generated by the power module on the environment, thus preventing the phenomenon of electromagnetic interference.

SUMMARY

One embodiment of the disclosure provides a power module including a power circuit board, a signal pin, a shielding substrate, and an electrically insulating component. The signal pin is disposed and stands on the power circuit board. The shielding substrate is located above the power circuit board and spaced apart from the power circuit board. The shielding substrate has a first through hole. The signal pin is disposed through the first through hole. The electrically insulating component surrounds the signal pin. The electrically insulating component has a second through hole. The signal pin is disposed through the second through hole. The signal pin is spaced apart from the shielding substrate by a distance by the electrically insulating component.

The above description about the content of the disclosure and the following description about the embodiments are used to demonstrate and explain the spirit and principle of the disclosure and provide a further explanation of the scope of claims of the disclosure.

BRIEF DESCRIPTION OF THE DRAWINGS

The disclosure will become better understood from the detailed description given herein below and the accompanying drawings which are given by way of illustration only and thus are not intending to limit the disclosure and wherein.

DETAILED DESCRIPTION

Figure 1:
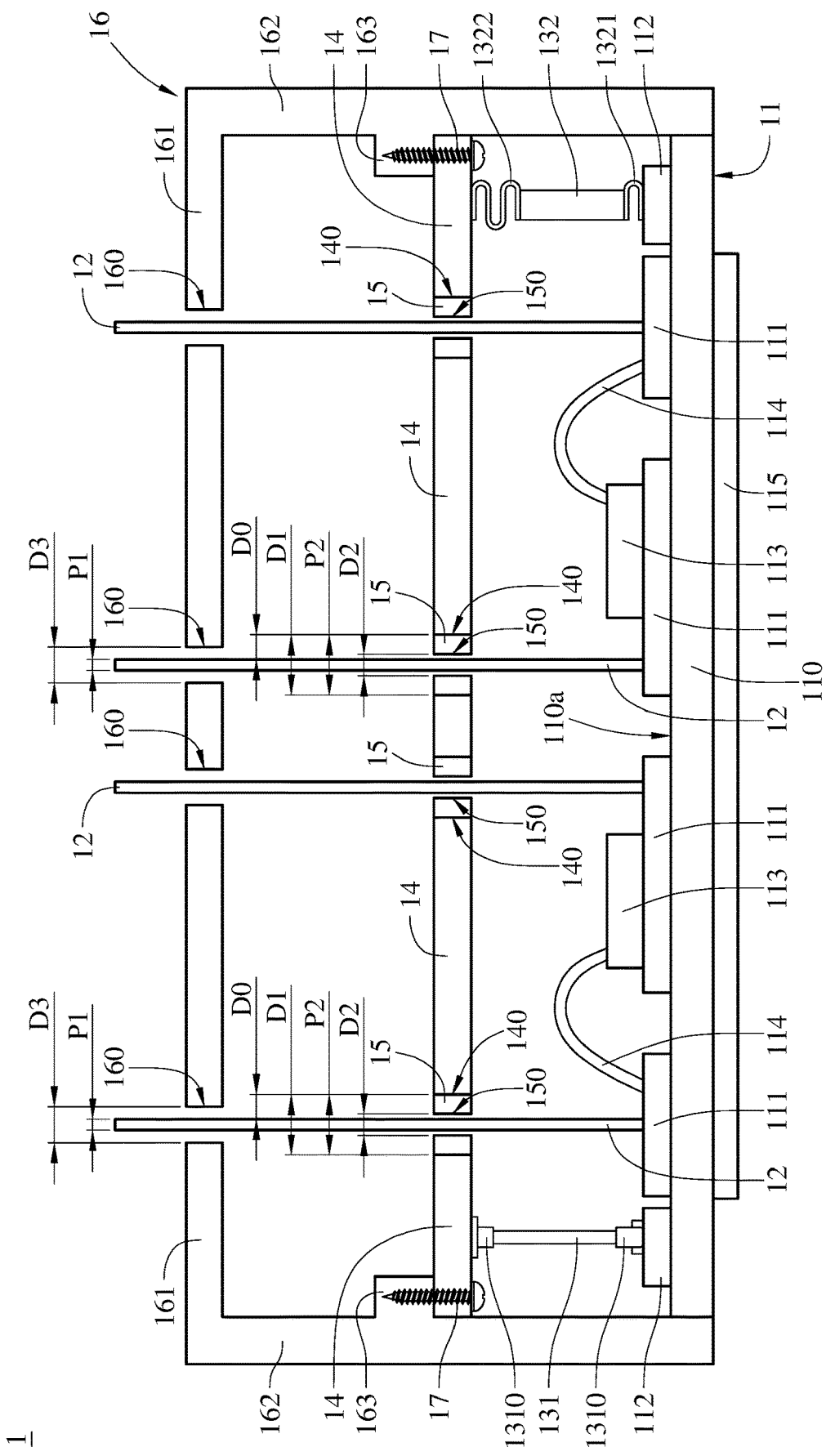
FIG. 1 is a schematic cross-sectional view of a power module according to one embodiment of the disclosure.

Features and advantages of embodiments of the disclosure are described in the following detailed description, it allows the person skilled in the art to understand the technical contents of the embodiments of the disclosure and implement them, and the person skilled in the art could easily comprehend the purposes of the advantages of the disclosure. The following embodiments are further illustrating the perspective of the disclosure, but not intending to limit the disclosure.

The drawings may not be drawn to actual size or scale, some exaggerations may be necessary in order to emphasize basic structural relationships, while some are simplified for clarity of understanding, but the disclosure is not limited thereto. It is allowed to have various adjustments under the spirit of the disclosure. In addition, the spatially relative terms, such as "up", "top", "above", "down", "low", "left", "right", "front", "rear", and "back" and the like, may be used herein for ease of description to describe the relationship of one element or feature to another element(s) of feature(s) as illustrated in the drawings. It will be understood that the spatially relative terms are intended to encompass orientations of the element or feature but not intended to limit the disclosure.

Please refer to FIG. 1 to FIG. 5. FIG. 1 is a schematic cross-sectional view of a power module 1 according to one embodiment of the disclosure. FIG. 2 to FIG. 5 are schematic cross-sectional views of a manufacturing process of the power module 1 in FIG. 1.

As shown in FIG. 1, the power module 1 includes a power circuit board 11, a plurality of signal pins 12, a first ground pin 131, a second ground pin 132, a shielding substrate 14, a plurality of electrically insulating components 15, a cover body 16, and a plurality of fixing components 17.

The power circuit board 11 includes a board body 110, a plurality of signal pads 111, a plurality of ground pads 112, a plurality of power chips 113, a plurality of bonding wires 114, and a thermal conductive pad 115. The signal pads 111 and the ground pads 112 are disposed on an upper surface 110a of the board body 110. The power chips 113 are respectively disposed on some of the signal pads 111. The bonding wires 114 are respectively electrically connected to the power chips 113 and other some of the signal pads 111. The signal pins 12 are respectively disposed and stand on the signal pads 111 of the power circuit board 11 and electrically connected to the signal pads 111. The first ground pin 131 and the second ground pin 132 are respectively disposed and stand on the ground pads 112 of the power circuit board 11 and are electrically connected to the ground pads 112. There are telescopic seats 1310 disposed on two ends of the first ground pin 131. There is a C-shaped elastic portion 1321 disposed on a lower end of the second ground pin 132, and there is an S-shaped elastic portion 1322 disposed on an upper end of the second ground pin 132. The C-shaped elastic portion 1321 has a curved arc. The S-shaped elastic portion 1322 has at least two curved arcs. The board body 110 is disposed on the thermal conductive pad 115.

In a circuit, the ground pin (e.g., the first ground pin 131 or the second ground pin 132) usually refers to the pin in the circuit that is connected to the ground, so in most cases, the ground pin is the negative pin. In circuits powered by a single power source, the negative pin is usually connected to the ground. However, in circuits powered by dual power sources, the ground pin could be any pin, depending on the circuit design and requirements. The term "ground pad" (e.g., the ground pads 112) mentioned here refers to the connection of ground, including but not limited to the negative pin.

The shielding substrate 14 is located above the power circuit board 11 and spaced apart from the power circuit board 11. The shielding substrate 14 has a plurality of first through holes 140. The quantity of the first through holes 140 may be greater than or equal to the quantity of the signal pins 12. The first ground pin 131 and the second ground pin 132 are in contact with the shielding substrate 14. The two ends of the first ground pin 131 are respectively disposed on the ground pad 112 of the power circuit board 11 and the shielding substrate 14 via the telescopic seats 1310. The first ground pin 131 is electrically connected to the ground pad 112 of the power circuit board 11 and the shielding substrate 14. The second ground pin 132 is disposed on the ground pad 112 of the power circuit board 11 via the C-shaped elastic portion 1321 and presses against the shielding substrate 14 via the S-shaped elastic portion 1322. The second ground pin 132 is electrically connected to the ground pad 112 of the power circuit board 11 and the shielding substrate 14. Types of the first ground pin 131 and the second ground pin 132 may be selected and combined arbitrarily. For example, there may be any two of a metal post, a telescopic seat, a C-shaped elastic portion, and an S-shaped elastic portion disposed on the two ends of the first ground pin 131 or the two ends of the second ground pin 132. Even if there are some degree of manufacturing deviations (errors) in the first ground pin 131 and the second ground pin 132, the influence caused by the manufacturing deviations (errors) may be compensated by any two of the telescopic seat, the C-shaped elastic portion, and the S-shaped elastic portion disposed on the first ground pin 131 and the second ground pin 132. In this embodiment, the shielding substrate 14 may be a copper board, but the disclosure is not limited thereto. The shielding substrate 14 may be a double-sided copper foil substrate or a single-sided copper foil substrate. A material of the shielding substrate 14 may include an electrically conductive material.

The electrically insulating components 15 respectively correspond to and surround the signal pins 12. The electrically insulating components 15 are fixed to the shielding substrate 14 and respectively located in the first through holes 140. Each of the electrically insulating components 15 has a second through hole 150. The signal pins 12 are respectively disposed through the second through holes 150 and also respectively disposed through the first through holes 140. Each of the signal pins 12 is spaced apart from the shielding substrate 14 by a distance D0 by the electrically insulating components 15. Especially, each of the signal pins 12 is electrically insulated from the shielding substrate 14 by the electrically insulating components 15. A hole diameter D2 of each of the second through holes 150 is greater than an outer diameter P1 of each of the signal pins 12. In this embodiment, a hole diameter D1 of each of the first through holes 140 is substantially equal to an outer diameter P2 of each of the electrically insulating components 15, but the disclosure is not limited thereto. As long as each of the electrically insulating components 15 could be fixed to the shielding substrate 14, and the electrically insulating components 15 are at least partially respectively located in the first through holes 140, the hole diameter D1 of each of the first through holes 140 may not be equal to the outer diameter P2 of each of the electrically insulating components 15. Additionally, a material of each of the electrically insulating components 15 may include silicone rubber, silicone rubber coating fiberglass, fiberglass braided silicone rubber, or polytetrafluoroethene.

The cover body 16 covers the power circuit board 11 and the shielding substrate 14. The cover body 16 includes a top plate 161, a side wall 162, and a plurality of protrusions 163. The side wall 162 surrounds the top plate 161, and the protrusions 163 are disposed on an inner side of the side wall 162. The shielding substrate 14 is fixed to each of the protrusions 163 of the cover body 16 by the fixing components 17, and the shielding substrate 14 is located under the protrusions 163. The top plate 161 of the cover body 16 has a plurality of third through holes 160. The signal pins 12 are respectively disposed through the third through holes 160. The quantity of the third through holes 160 may be greater than or equal to the quantity of the signal pins 12. A hole diameter D3 of each of the third through holes 160 is greater than the outer diameter P1 of each of the signal pins 12. A material of the cover body 16 may include electrically insulating material. The fixing components 17 may be screws or bolts.

The shielding substrate 14 is electrically connected to the ground pads 112 of the power circuit board 11 via the first ground pin 131 and the second ground pin 132. Therefore, when the power module 1 is in operation, the shielding substrate 14 is also grounded. By grounding the shielding substrate 14, the shielding substrate 14 provides an electromagnetic interference shielding effect, and the electromagnetic wave generated by the power chips 113 of the power circuit board 11 does not easily leak out of the cover body 16. Additionally, an electrical insulation between the signal pins 12 and the shielding substrate 14 is ensured by the electrically insulating components 15.

Figure 2:
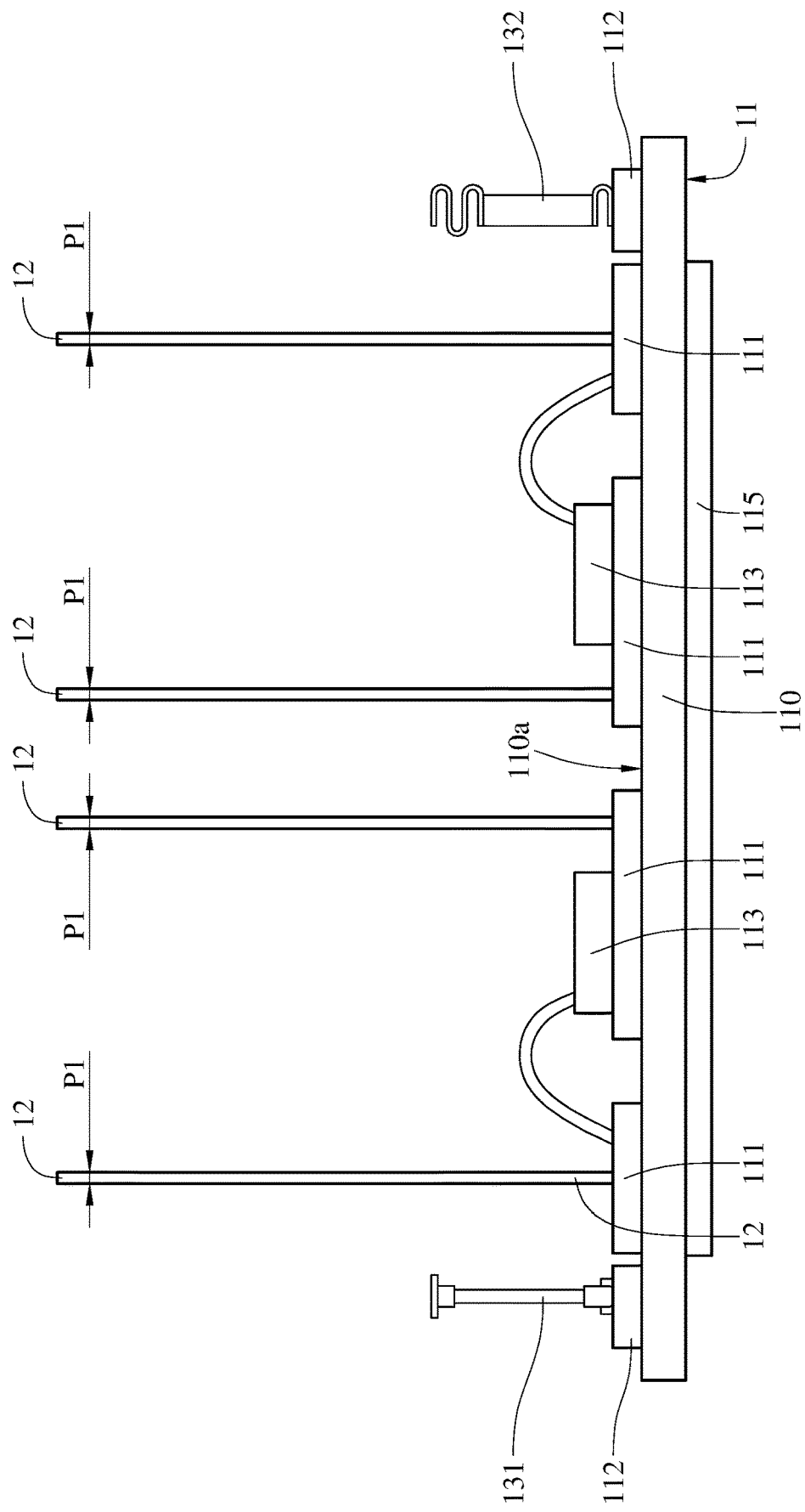
FIG. 2 is a schematic cross-sectional view of a manufacturing process of the power module in FIG. 1.

As shown in FIG. 2 to FIG. 5, the manufacturing process of the power module 1 in FIG. 1 is described. As shown in FIG. 2, the power circuit board 11 is provided. The power circuit board 11 includes the board body 110, the plurality of the signal pads 111, the plurality of the ground pads 112, and the plurality of the power chips 113. The signal pads 111 and the ground pads 112 are disposed on the upper surface 110a of the board body 110. The power chips 113 are disposed on some of the signal pads 111. The signal pins 12 are respectively disposed and stand on the signal pads 111 of the power circuit board 11, and the signal pins 12 are electrically connected to the signal pads 111. Each of the signal pins 12 has the outer diameter P1. The first ground pin 131 and the second ground pin 132 are respectively disposed and stand on the ground pads 112 of the power circuit board 11 and are electrically connected to the ground pads 112. The board body 110 is disposed on the thermal conductive pad 115. The manufacturing process shown in FIG. 2 is defined as a first step.

Figure 3:
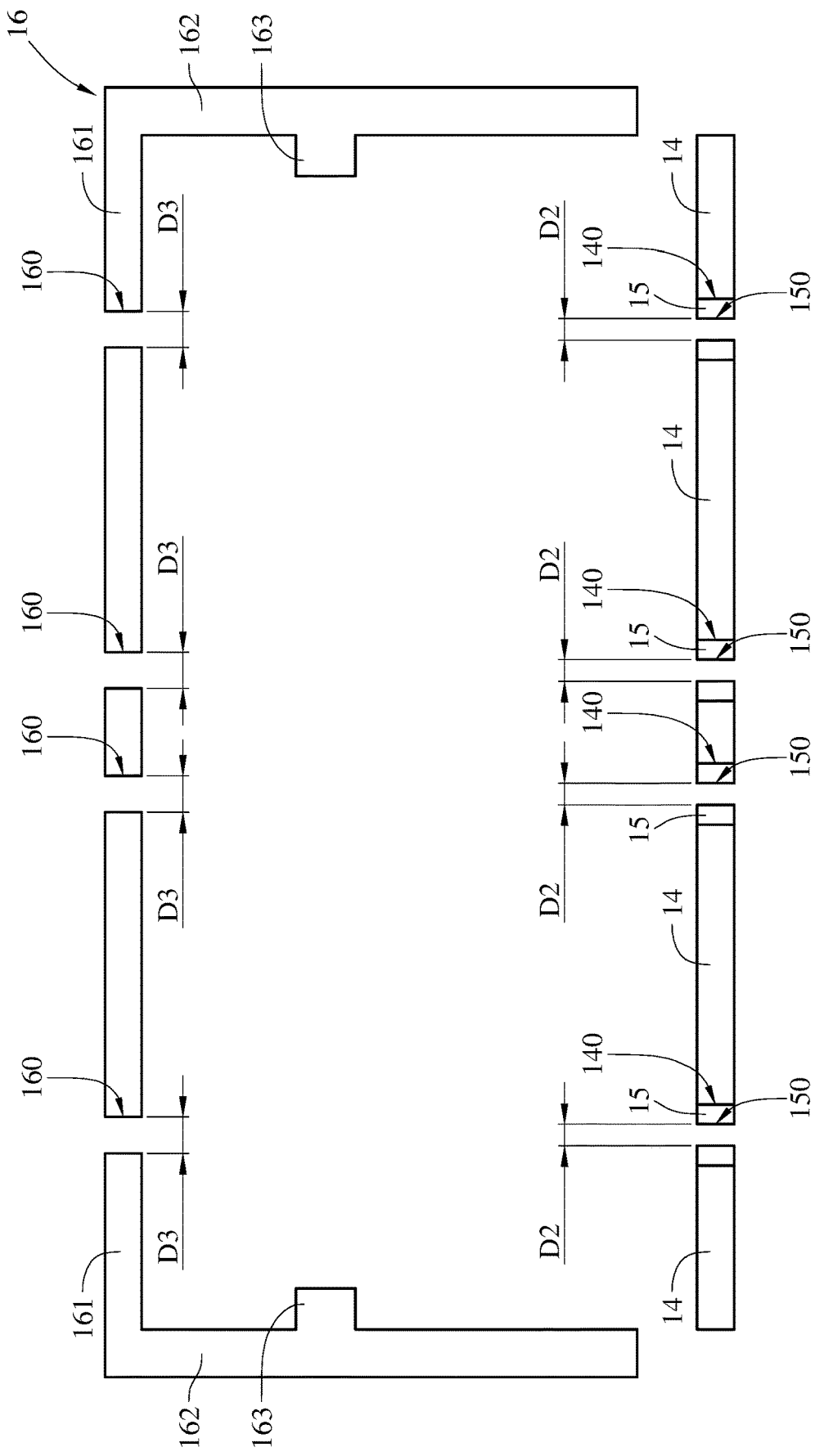
FIG. 3 is a schematic cross-sectional view of the manufacturing process of the power module in FIG. 1.

As shown in FIG. 3, the cover body 16 is provided. The cover body 16 includes the top plate 161, the side wall 162, and the plurality of the protrusions 163. The top plate 161 has the plurality of the third through holes 160. The side wall 162 surrounds the top plate 161, and the protrusions 163 are disposed on the inner side of the side wall 162. The shielding substrate 14 is provided. The shielding substrate 14 has the plurality of the first through holes 140. The electrically insulating components 15 are fixed to the shielding substrate 14 and respectively located in the first through holes 140. Each of the electrically insulating components 15 has the second through hole 150. As shown in FIG. 2 and FIG. 3, positions of the second through holes 150 respectively correspond to positions of the signal pins 12. The hole diameter D2 of each of the second through holes 150 is greater than the outer diameter P1 of each of the signal pins 12. Positions of the third through holes 160 respectively correspond to the positions of the signal pins 12. The hole diameter D3 of each of the third through holes 160 is greater than the outer diameter P1 of each of the signal pins 12 in FIG. 2.

Figure 4:
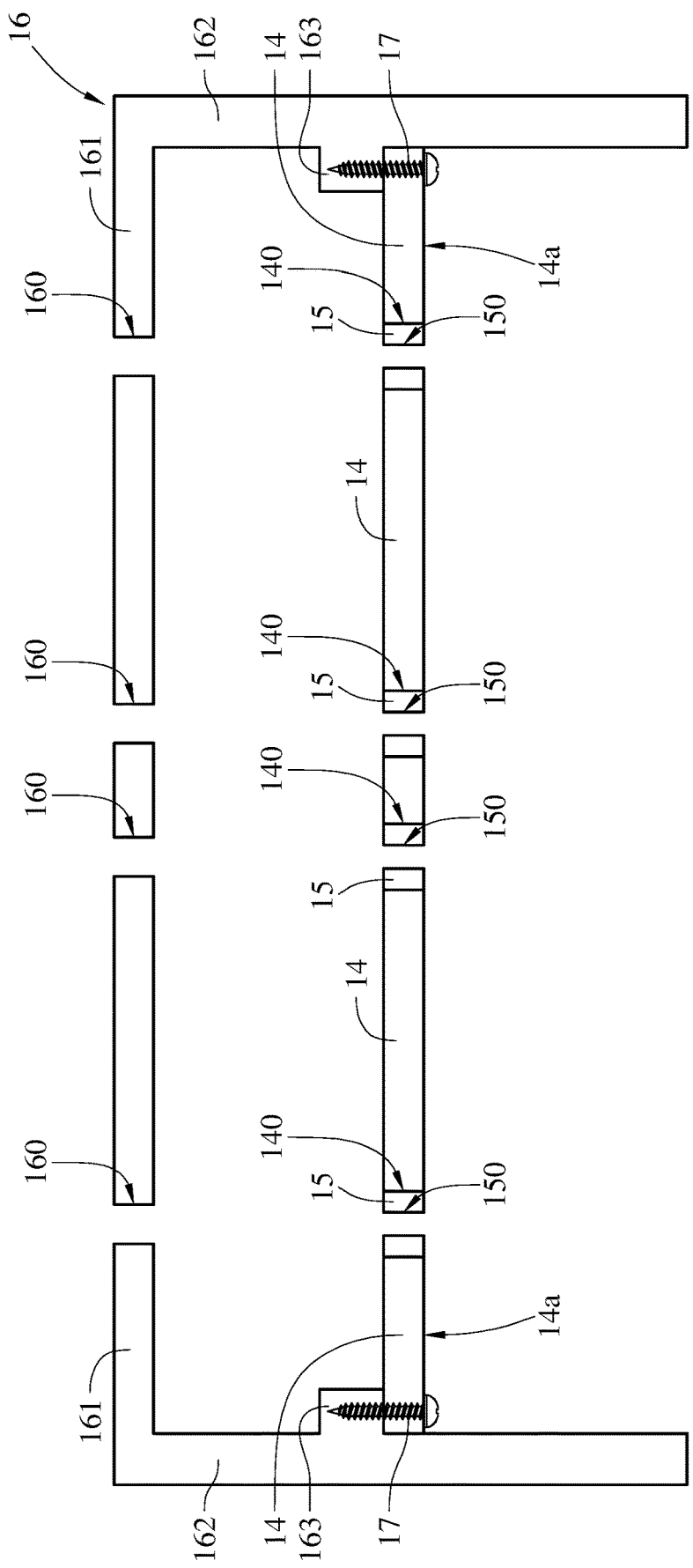
FIG. 4 is a schematic cross-sectional view of the manufacturing process of the power module in FIG. 1.

As shown in FIG. 4, the fixing components 17 are used to fix the shielding substrate 14 to the cover body 16. The shielding substrate 14 is located under the top plate 161 and inside the side wall 162. The fixing components 17 penetrate through the shielding substrate 14 from a lower surface 14a of the shielding substrate 14 and are respectively screwed into the protrusions 163 of the cover body 16. The fixing components 17 fix the shielding substrate 14 to each of the protrusions 163 of the cover body 16. At this time, the cover body 16 covers the shielding substrate 14. The manufacturing process shown in FIG. 3 and FIG. 4 is defined as a second step.

The order of the first step and the second step is not limited. In the same manufacturing line, the first step may be performed before the second step, or the second step may be performed before the first step. In different manufacturing lines, the first step and the second step may be performed at different times or at the same time.

Figure 5:
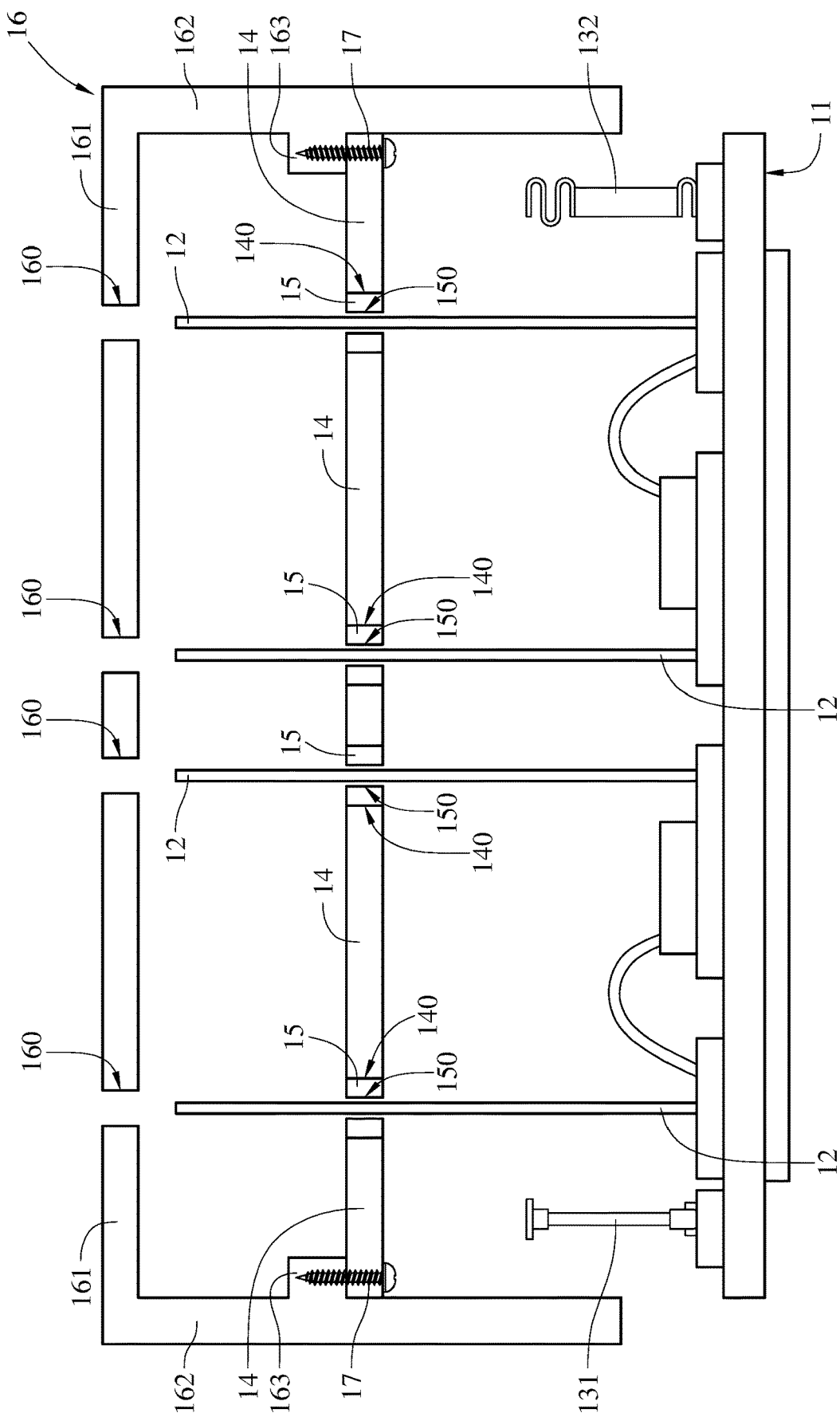
FIG. 5 is a schematic cross-sectional view of the manufacturing process of the power module in FIG. 1.

As shown in FIG. 5, place the shielding substrate 14 and the cover body 16 above the power circuit board 11 to cover the power circuit board 11. The signal pins 12 are respectively aligned with the second through holes 150 of the electrically insulating components 15, respectively aligned with the third through holes 160 of the top plate 161 of the cover body 16, and respectively disposed through the second through holes 150 and the third through holes 160 in sequence. Thereby, the manufacture of the power module 1 shown in FIG. 1 is completed.

Figure 6:
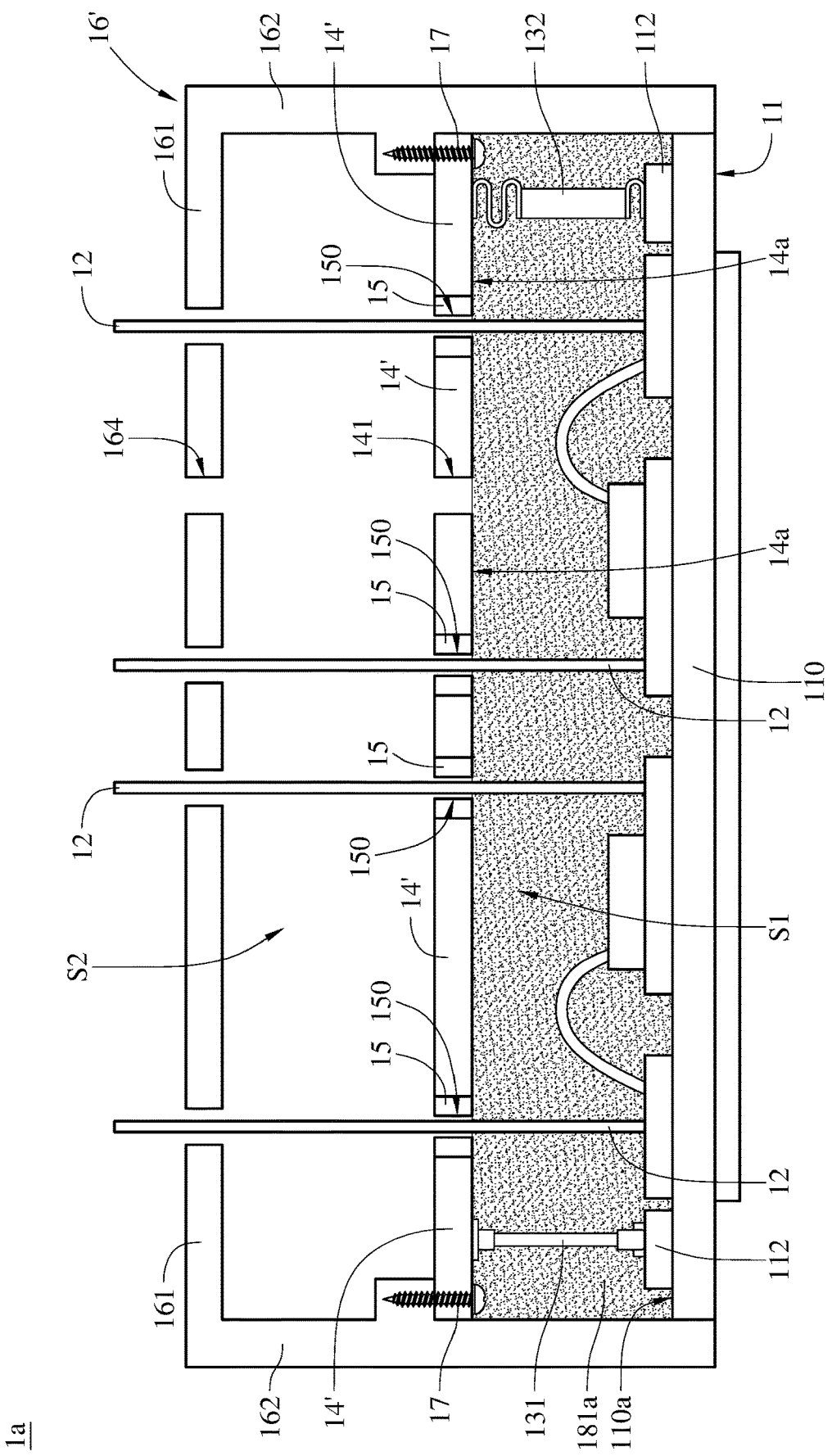
FIG. 6 is a schematic cross-sectional view of a power module according to another embodiment of the disclosure.

Please refer to FIG. 6. FIG. 6 is a schematic cross-sectional view of a power module 1a according to another embodiment of the disclosure. The power module 1a shown in FIG. 6 is similar to the power module 1 shown in FIG. 1 in structure. As shown in FIG. 6, the power module 1a includes the power circuit board 11, the plurality of the signal pins 12, the first ground pin 131, the second ground pin 132, a shielding substrate 14', the plurality of the electrically insulating components 15, a cover body 16', and the plurality of the fixing components 17.

The signal pins 12, the first ground pin 131, and the second ground pin 132 are disposed and stand on the power circuit board 11. The shielding substrate 14' is located above the power circuit board 11 and spaced apart from the power circuit board 11. The first ground pin 131 and the second ground pin 132 are electrically connected to the shielding substrate 14' and the ground pads 112 of the power circuit board 11. The signal pins 12 are respectively disposed through the electrically insulating components 15 and are disposed through the shielding substrate 14'. The electrically insulating components 15 are fixed to the shielding substrate 14', and each of the signal pins 12 is spaced apart from the shielding substrate 14 by a distance by electrically insulating components 15. The cover body 16' covers the power circuit board 11 and the shielding substrate 14'. The shielding substrate 14' is fixed to the cover body 16' by the fixing components 17.

In this embodiment, the shielding substrate 14' further has a first filling hole 141, and the cover body 16' further has a second filling hole 164. The power module 1a further includes a first filling glue 181a. There is a first space S1 formed inside the side wall 162 of the cover body 16' and between the upper surface 110a of the board body 110 and the lower surface 14a of the shielding substrate 14'. A filling nozzle (not shown) for filling the first filling glue 181a into the first space S1 may be inserted in the second filling hole 164 of the cover body 16' and the first filling hole 141 of the shielding substrate 14' and fill the first filling glue 181a into the first space S1. In this embodiment, the first filling glue 181a may be filled into the first space S1 to be in contact with the lower surface 14a of the shielding substrate 14', but the disclosure is not limited thereto. In other embodiments, the first filling glue 181a may further be filled into the second through holes 150 of the electrically insulating components 15 and the first filling hole 141 of the shielding substrate 14'.

Additionally, there is a second space S2 formed under the top plate 161 of the cover body 16', inside the side wall 162, and above the shielding substrate 14'. In this embodiment, there is no filling glue disposed in the second space S2, but the disclosure is not limited thereto. In other embodiments, a second filling glue (not shown) may be filled into the second space S2, the second through holes 150 of the electrically insulating components 15, and the first filling hole 141 of the shielding substrate 14'.

Figure 7:
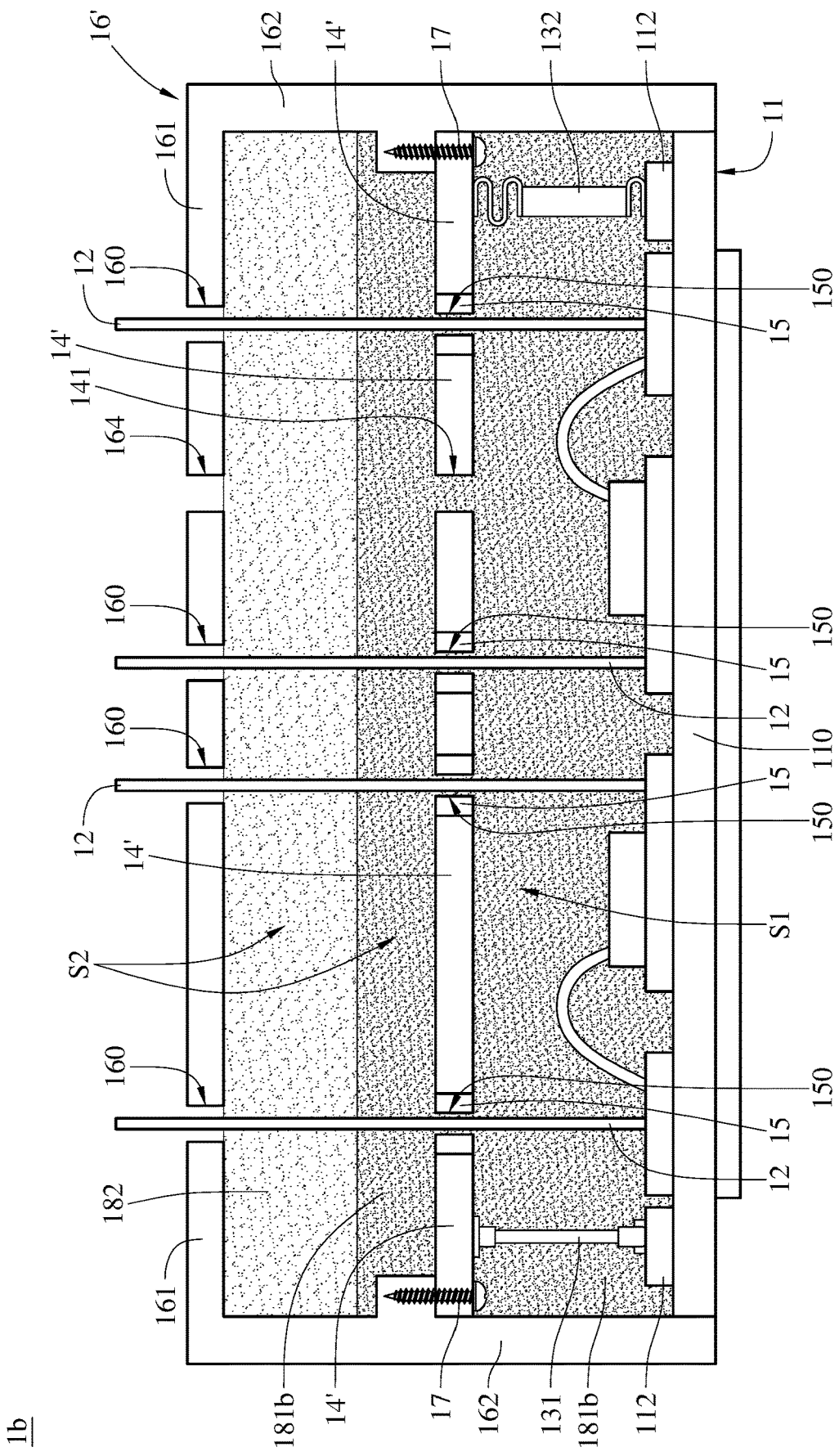
FIG. 7 is a schematic cross-sectional view of a power module according to another embodiment of the disclosure.

Please refer to FIG. 7. FIG. 7 is a schematic cross-sectional view of a power module 1b according to another embodiment of the disclosure. The power module 1b shown in FIG. 7 is similar to the power module 1a shown in FIG. 6 in structure. As shown in FIG. 7, the power module 1b includes the power circuit board 11, the plurality of the signal pins 12, the first ground pin 131, the second ground pin 132, the shielding substrate 14', the plurality of the electrically insulating components 15, the cover body 16', and the plurality of the fixing components 17.

The signal pins 12, the first ground pin 131, and the second ground pin 132 are disposed and stand on the power circuit board 11. The shielding substrate 14' is located above the power circuit board 11 and spaced apart from the power circuit board 11. The first ground pin 131 and the second ground pin 132 are electrically connected to the shielding substrate 14' and the ground pads 112 of the power circuit board 11. The signal pins 12 are respectively disposed through the electrically insulating components 15 and are disposed through the shielding substrate 14'. The electrically insulating components 15 are fixed to the shielding substrate 14', and each of the signal pins 12 is spaced apart from the shielding substrate 14 by a distance by electrically insulating components 15. The cover body 16' covers the power circuit board 11 and the shielding substrate 14'. The shielding substrate 14' is fixed to the cover body 16' by the fixing components 17.

There is a first space S1 formed inside the side wall 162 of the cover body 16' and between the board body 110 and the shielding substrate 14'. There is a second space S2 formed under the top plate 161 of the cover body 16', inside the side wall 162, and above the shielding substrate 14'. The power module 1b further includes a first filling glue 181b and a second filling glue 182. A filling nozzle (not shown) for filling the first filling glue 181b may be inserted in the second filling hole 164 of the cover body 16' and fill the first filling glue 181a into the first space S1, the second through holes 150 of the electrically insulating components 15, the first filling hole 141 of the shielding substrate 14', and a part of the second space S2. Additionally, a filling nozzle (not shown) for filling the second filling glue 182 may be inserted in the second filling hole 164 of the cover body 16' and fill the second filling glue 182 into another part of the second space S2 where the first filling glue 181b is not filled, but the disclosure is not limited thereto. In other embodiments, the second filling glue 182 may further be filled into the third through holes 160 of the top plate 161 of the cover body 16' and the second filling hole 164.

In this embodiment, a hardness of the second filling glue 182 is greater than a hardness of the first filling glue 181b. An elastic modulus of the second filling glue 182 is greater than an elastic modulus of the first filling glue 181b. A dielectric coefficient of the second filling glue 182 is greater than a dielectric coefficient of the first filling glue 181b. In other embodiments, a hardness of the second filling glue 182 may be smaller than a hardness of the first filling glue 181b. An elastic modulus of the second filling glue 182 may be smaller than an elastic modulus of the first filling glue 181b. A dielectric coefficient of the second filling glue 182 may be smaller than a dielectric coefficient of the first filling glue 181b.

Figure 8:
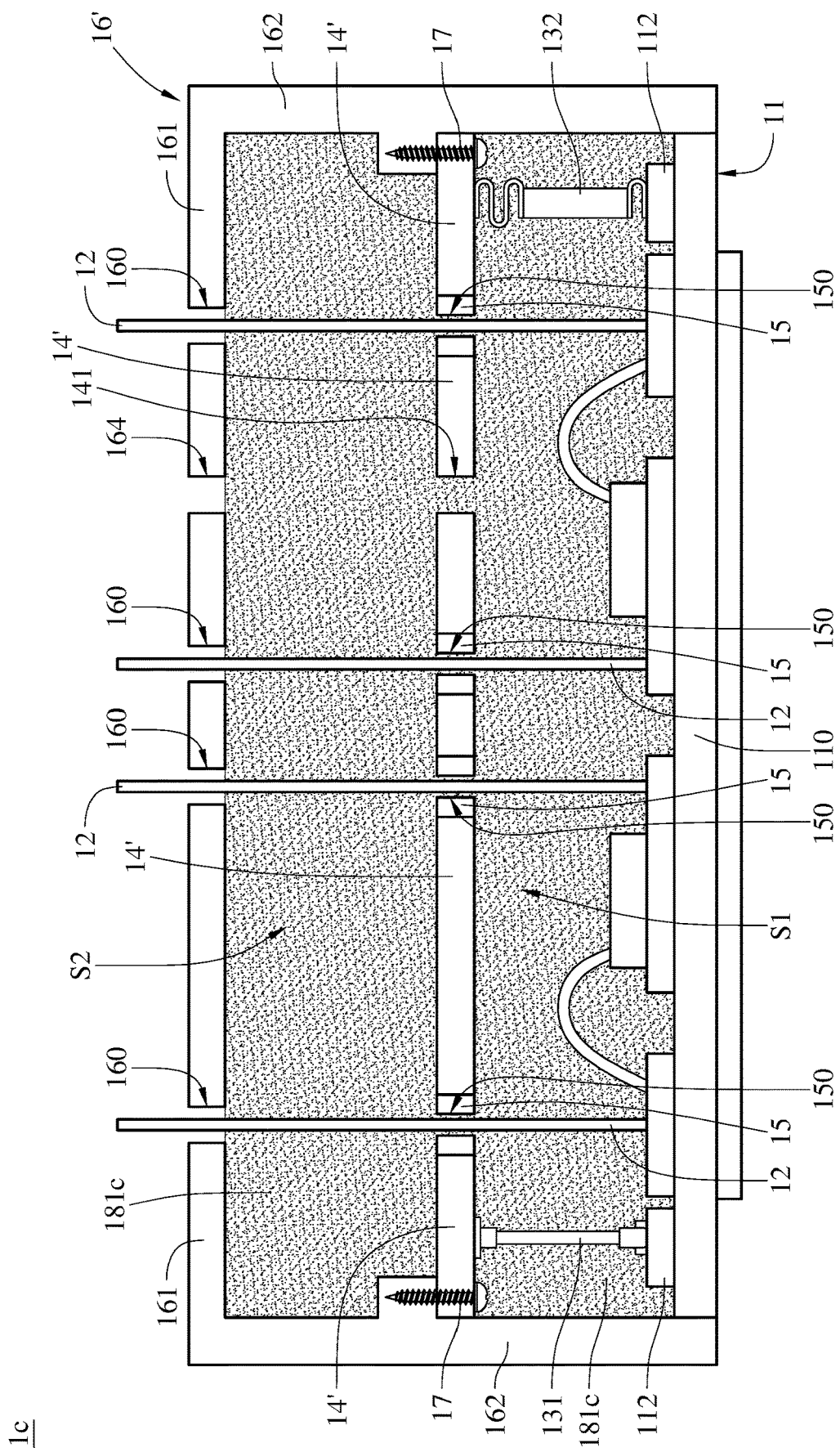
FIG. 8 is a schematic cross-sectional view of a power module according to another embodiment of the disclosure.

Please refer to FIG. 8. FIG. 8 is a schematic cross-sectional view of a power module 1c according to another embodiment of the disclosure. The power module 1c shown in FIG. 8 is similar to the power module 1a shown in FIG. 6 in structure. As shown in FIG. 8, the power module 1c includes the power circuit board 11, the plurality of the signal pins 12, the first ground pin 131, the second ground pin 132, the shielding substrate 14', the plurality of the electrically insulating components 15, the cover body 16', and the plurality of the fixing components 17.

The signal pins 12, the first ground pin 131, and the second ground pin 132 are disposed and stand on the power circuit board 11. The shielding substrate 14' is located above the power circuit board 11 and spaced apart from the power circuit board 11. The first ground pin 131 and the second ground pin 132 are electrically connected to the shielding substrate 14' and the ground pads 112 of the power circuit board 11. The signal pins 12 are respectively disposed through the electrically insulating components 15 and are disposed through the shielding substrate 14'. The electrically insulating components 15 are fixed to the shielding substrate 14', and each of the signal pins 12 is spaced apart from the shielding substrate 14 by the electrically insulating components 15. The cover body 16' covers the power circuit board 11 and the shielding substrate 14'. The shielding substrate 14' is fixed to the cover body 16' by the fixing components 17.

There is a first space S1 formed inside the side wall 162 of the cover body 16' and between the board body 110 and the shielding substrate 14'. There is a second space S2 formed under the top plate 161 of the cover body 16', inside the side wall 162, and above the shielding substrate 14'. The power module 1b further includes a filling glue 181c. A filling nozzle (not shown) for filling the filling glue 181c may be inserted in the second filling hole 164 of the cover body 16', and fill the filling glue 181c into the first space S1, the second through holes 150 of the electrically insulating components 15, the first filling hole 141 of the shielding substrate 14', and the second space S2, but the disclosure is not limited thereto. In other embodiments, the filling glue 181c may be further filled into the third through holes 160 and the second filling hole 164 of the top plate 161 of the cover body 16'.

Figure 9:
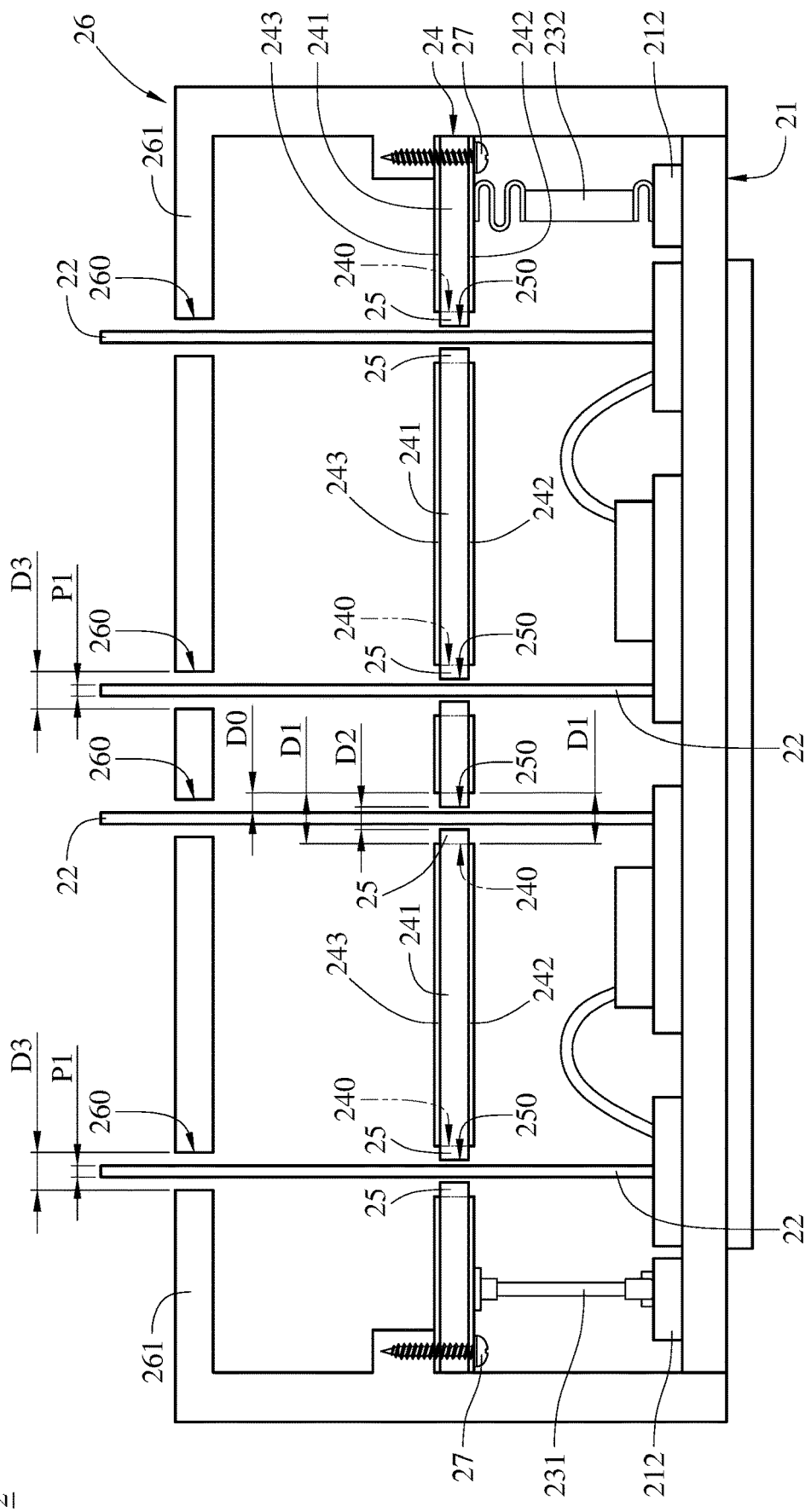
FIG. 9 is a schematic cross-sectional view of a power module according to another embodiment of the disclosure.

Please refer to FIG. 9. FIG. 9 is a schematic cross-sectional view of a power module 2 according to another embodiment of the disclosure. The power module 2 shown in FIG. 9 is similar to the power module 1 shown in FIG. 1 in structure. As shown in FIG. 9, the power module 2 includes a power circuit board 21, a plurality of signal pins 22, a first ground pin 231, a second ground pin 232, a shielding substrate 24, a plurality of electrically insulating components 25, a cover body 26, and a plurality of fixing components 27.

The signal pins 22, the first ground pin 231, and the second ground pin 232 are disposed and stand on the power circuit board 21. The first ground pin 231 and the second ground pin 232 are respectively disposed and stand on a plurality of ground pads 212 of the power circuit board 21 and are electrically connected to the ground pads 212.

The shielding substrate 24 includes a core layer 241, a lower electrically conductive layer 242, and an upper electrically conductive layer 243, and the shielding substrate 24 has a plurality of first through holes 240. Each of the first through holes 240 passes through the upper electrically conductive layer 243, the core layer 241, and the lower electrically conductive layer 242 in sequence. The electrically insulating components 25 are respectively disposed in the first through holes 240 of the shielding substrate 24. The electrically insulating components 25 and the core layer 241 of the shielding substrate 24 are integrated in one piece. The shielding substrate 24 is located above the power circuit board 21 and spaced apart from the power circuit board 21. The lower electrically conductive layer 242 is disposed on a side of the core layer 241 located closer to the power circuit board 21, the upper electrically conductive layer 243 is disposed on a side of the core layer 241 located farther away from the power circuit board 21.

Each of the electrically insulating components 25 has a second through hole 250. The signal pins 22 are respectively disposed through the second through holes 250 and also respectively disposed through the first through holes 240. The electrically insulating components 25 respectively correspond to and surround the signal pins 22. Each of the signal pins 22 is spaced apart from the shielding substrate 24 by a distance D0 by the electrically insulating components 25. Especially, each of the signal pins 22 is electrically insulated from the upper electrically conductive layer 243 and the lower electrically conductive layer 242 of the shielding substrate 24 by the electrically insulating components 25. A hole diameter D1 of each of the first through holes 240 is greater than a hole diameter D2 of each of the second through holes 250. The hole diameter D2 of each of the second through holes 250 is greater than an outer diameter P1 of each of the signal pins 22.

In specific, when the shielding substrate 24 and the electrically insulating components 25 are manufactured, a double-sided copper foil substrate which includes an upper copper foil, a core layer material, and a lower copper foil stacked in sequence may be used. The second through holes 250 are formed at positions where the signal pins 22 are to be disposed. Moreover, the copper foils located around each of the second through holes 250 are removed. Parts of the core layer material exposed due to the above removal of the copper foils are defined as the electrically insulating components 25. The remaining upper copper foil is defined as the upper electrically conductive layer 243, and the remaining lower copper foil is defined as the lower electrically conductive layer 242. A part of the core layer material covered by the upper copper foil and the lower copper foil is defined as the core layer 241. Boundaries between a region where the upper copper foil and the lower copper foil cover and a region where the upper copper foil and the lower copper foil do not cover define the first through holes 240.

The first ground pin 231 and the second ground pin 232 are electrically connected to the lower electrically conductive layer 242 of the shielding substrate 24 and the ground pads 212 of the power circuit board 21. The cover body 26 covers the power circuit board 21 and the shielding substrate 24. The shielding substrate 24 is fixed to the cover body 26 by the fixing components 27. A top plate 261 of the cover body 26 has a plurality of third through holes 260. The signal pins 22 are respectively disposed through the third through holes 260. A hole diameter D3 of each of the third through holes 260 is greater than the outer diameter P1 of each of the signal pins 22.

Figure 10:
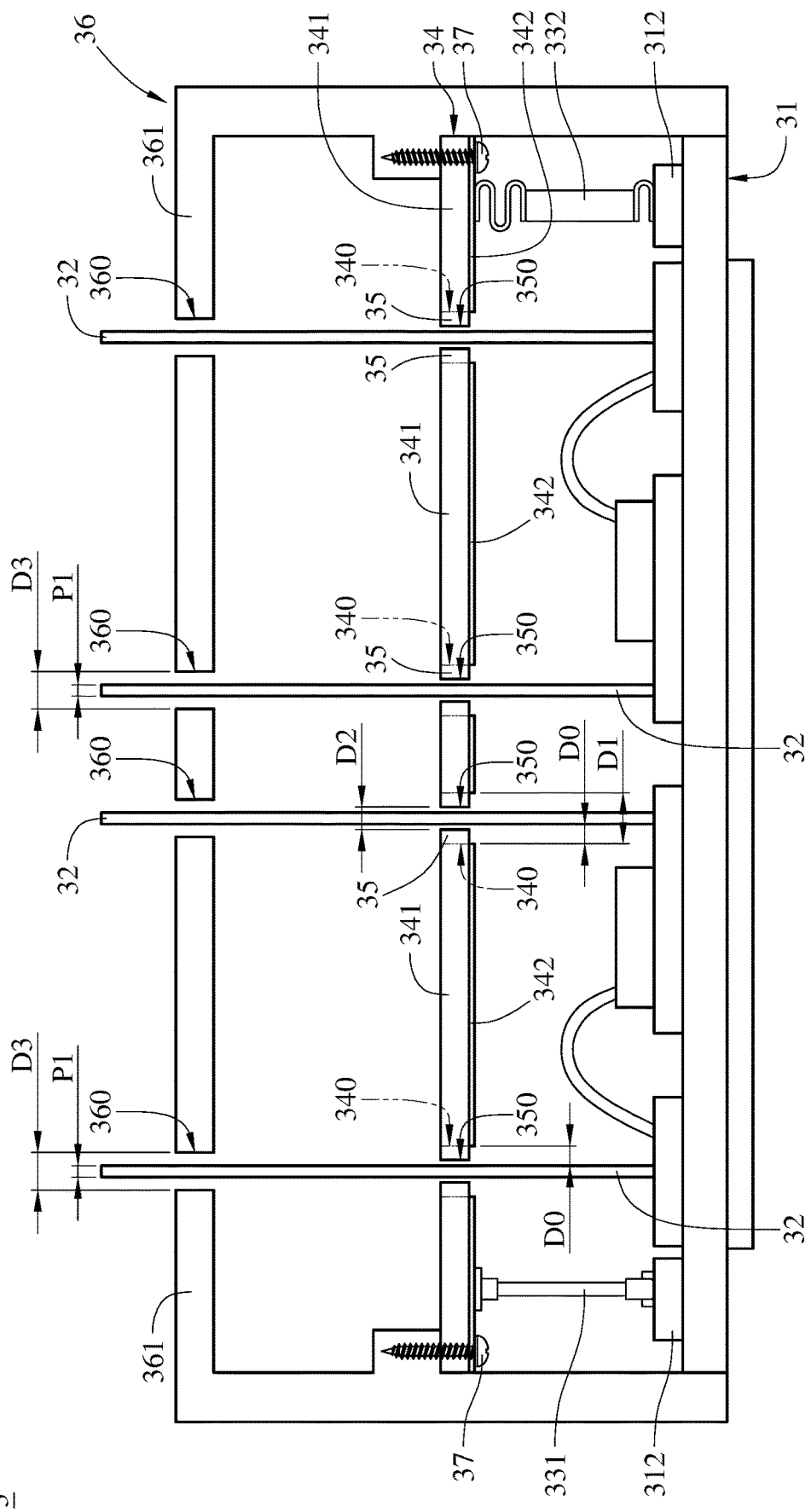
FIG. 10 is a schematic cross-sectional view of a power module according to another embodiment of the disclosure.

Please refer to FIG. 10. FIG. 10 is a schematic cross-sectional view of a power module 3 according to another embodiment of the disclosure. The power module 3 shown in FIG. 10 is similar to the power module 2 shown in FIG. 9 in structure. As shown in FIG. 10, the power module 3 includes a power circuit board 31, a plurality of signal pins 32, a first ground pin 331, a second ground pin 332, a shielding substrate 34, a plurality of electrically insulating components 35, a cover body 36, and a plurality of fixing components 37.

The signal pins 32, the first ground pin 331, and the second ground pin 332 are disposed and stand on the power circuit board 31. The first ground pin 331 and the second ground pin 332 are respectively disposed and stand on a plurality of ground pads 312 of the power circuit board 31 and are electrically connected to the ground pads 312.

The shielding substrate 34 includes a core layer 341 and a lower electrically conductive layer 342, and the shielding substrate 34 has a plurality of first through holes 340. Each of the first through holes 340 passes through the core layer 341 and the lower electrically conductive layer 342 in sequence. The electrically insulating components 35 are respectively disposed in the first through holes 340 of the shielding substrate 34. The electrically insulating components 35 and the core layer 341 of the shielding substrate 34 are integrated in one piece. The shielding substrate 34 is located above the power circuit board 31 and spaced apart from the power circuit board 31. The lower electrically conductive layer 342 is disposed on a side of the core layer 341 located closer to the power circuit board 31.

Each of the electrically insulating components 35 has a second through hole 350. The signal pins 32 are respectively disposed through the second through holes 350 and also respectively disposed through the first through holes 340. The electrically insulating components 35 respectively correspond to and surround the signal pins 32. Each of the signal pins 32 is spaced apart from the shielding substrate 34 by a distance D0 by the electrically insulating components 35. Especially, each of the signal pins 32 is electrically insulated from the lower electrically conductive layer 342 of the shielding substrate 34 by the electrically insulating components 35. A hole diameter D1 of each of the first through holes 340 is greater than a hole diameter D2 of each of the second through holes 350. The hole diameter D2 of each of the second through holes 350 is greater than an outer diameter P1 of each of the signal pins 32.

In specific, when the shielding substrate 34 and the electrically insulating components 35 are manufactured, a single-sided copper foil substrate which includes a core layer material and a lower copper foil stacked in sequence may be used. The second through holes 350 are formed at positions where the signal pins 32 are to be disposed. Moreover, the copper foils located around each of the second through holes 350 are removed. Parts of the core layer material exposed due to the above removal of the copper foils are defined as the electrically insulating components 35. The remaining lower copper foil is defined as the lower electrically conductive layer 342. A part of the core layer material covered by the lower copper foil is defined as the core layer 341. Boundaries between a region where the lower copper foil covers and a region where the lower copper foil does not cover define the first through holes 340.

The first ground pin 331 and the second ground pin 332 are electrically connected to the lower electrically conductive layer 342 of the shielding substrate 34 and the ground pads 312 of the power circuit board 31. The cover body 36 covers the power circuit board 31 and the shielding substrate 34. The shielding substrate 34 is fixed to the cover body 36 by the fixing components 37. A top plate 361 of the cover body 36 has a plurality of third through holes 360. The signal pins 32 are respectively disposed through the third through holes 360. A hole diameter D3 of each of the third through holes 360 is greater than the outer diameter P1 of each of the signal pins 32.

Figure 11:
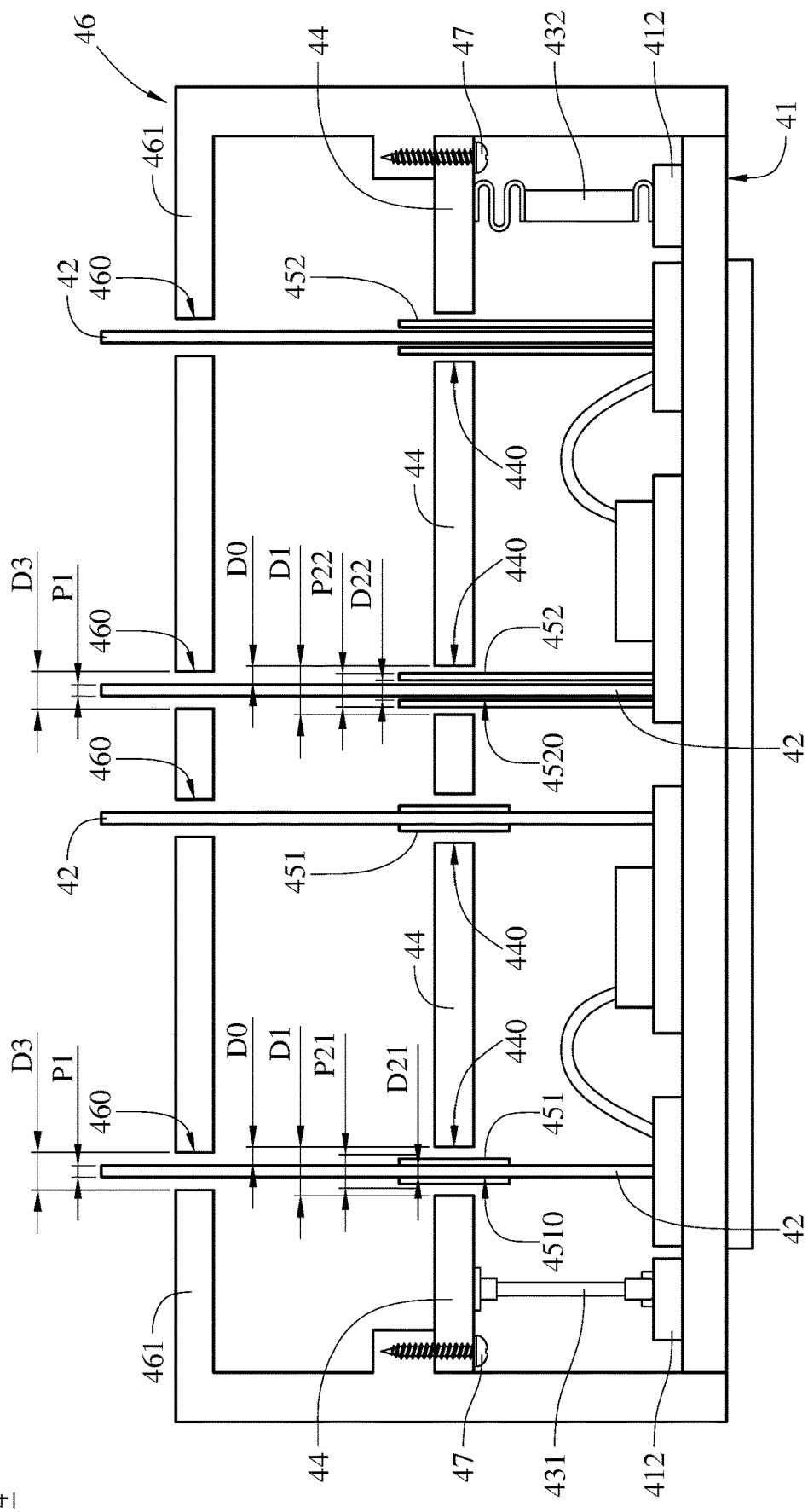
FIG. 11 is a schematic cross-sectional view of a power module according to another embodiment of the disclosure.

Please refer to FIG. 11. FIG. 11 is a schematic cross-sectional view of a power module 4 according to another embodiment of the disclosure. The power module 4 shown in FIG. 11 is similar to the power module 1 shown in FIG. 1 in structure. As shown in FIG. 11, the power module 4 includes a power circuit board 41, a plurality of signal pins 42, a first ground pin 431, a second ground pin 432, a shielding substrate 44, a plurality of electrically insulating components 451 and 452, a cover body 46, and a plurality of fixing components 47.

The signal pins 42, the first ground pin 431, and the second ground pin 432 are disposed and stand on the power circuit board 41. The first ground pin 431 and the second ground pin 432 are respectively disposed and stand on a plurality of ground pads 412 of the power circuit board 41 and are electrically connected to the ground pads 412.

A shape of each of the electrically insulating components 451 may be a sleeve having a second through hole 4510. The electrically insulating components 451 are respectively sleeved on some of the signal pins 42, such that the signal pins 42 are respectively disposed through the second through holes 4510 of the electrically insulating components 451. The electrically insulating components 451 may be respectively and closely attached to the signal pins 42 which the electrically insulating components 451 are respectively sleeved on. A hole diameter D21 of each of the second through holes 4510 of each of the electrically insulating components 451 is substantially equal to an outer diameter P1 of each of the signal pins 42.

A shape of each of the electrically insulating components 452 may be a sleeve having a second through hole 4520. The electrically insulating components 452 are respectively sleeved on some of the signal pins 42, such that the signal pins 42 are respectively disposed through the second through holes 4520 of the electrically insulating components 452. The electrically insulating components 452 may be respectively slidable relative to but not closely attached to the signal pins 42 which the electrically insulating components 452 are sleeved on. A hole diameter D22 of each of the second through holes 4520 of each of the electrically insulating components 452 is greater than the outer diameter P1 of each of the signal pins 42.

The shielding substrate 44 is located above the power circuit board 41 and spaced apart from the power circuit board 41. The shielding substrate 44 has a plurality of first through holes 440. The signal pins 42 which the electrically insulating components 451 are sleeved on and the electrically insulating components 451 are together disposed through the first through holes 440 of the shielding substrate 44. A hole diameter D1 of each of the first through holes 440 is greater than an outer diameter P21 of each of the electrically insulating components 451. The signal pins 42 which the electrically insulating components 452 are sleeved on and the electrically insulating components 452 are together disposed through the first through holes 440 of the shielding substrate 44. The hole diameter D1 of each of the first through holes 440 is greater than an outer diameter P22 of each of the electrically insulating components 452.

The electrically insulating components 451 and 452 respectively surround the signal pins 42. Each of the signal pins 42 is spaced apart from the shielding substrate 44 by a distance D0 by the electrically insulating components 451 or 452. Especially, the signal pins 42 are electrically insulated from the shielding substrate 44 by the electrically insulating components 451 or 452.

The first ground pin 431 and the second ground pin 432 are electrically connected to the shielding substrate 44 and the ground pads 412 of the power circuit board 41. The cover body 46 covers the power circuit board 41 and the shielding substrate 44. The shielding substrate 44 is fixed to the cover body 46 by the fixing components 47. A top plate 461 of the cover body 46 has a plurality of third through holes 460. The signal pins 42 are respectively disposed through the third through holes 460. A hole diameter D3 of each of the third through holes 460 is greater than the outer diameter P1 of each of the signal pins 42.

Figure 12:
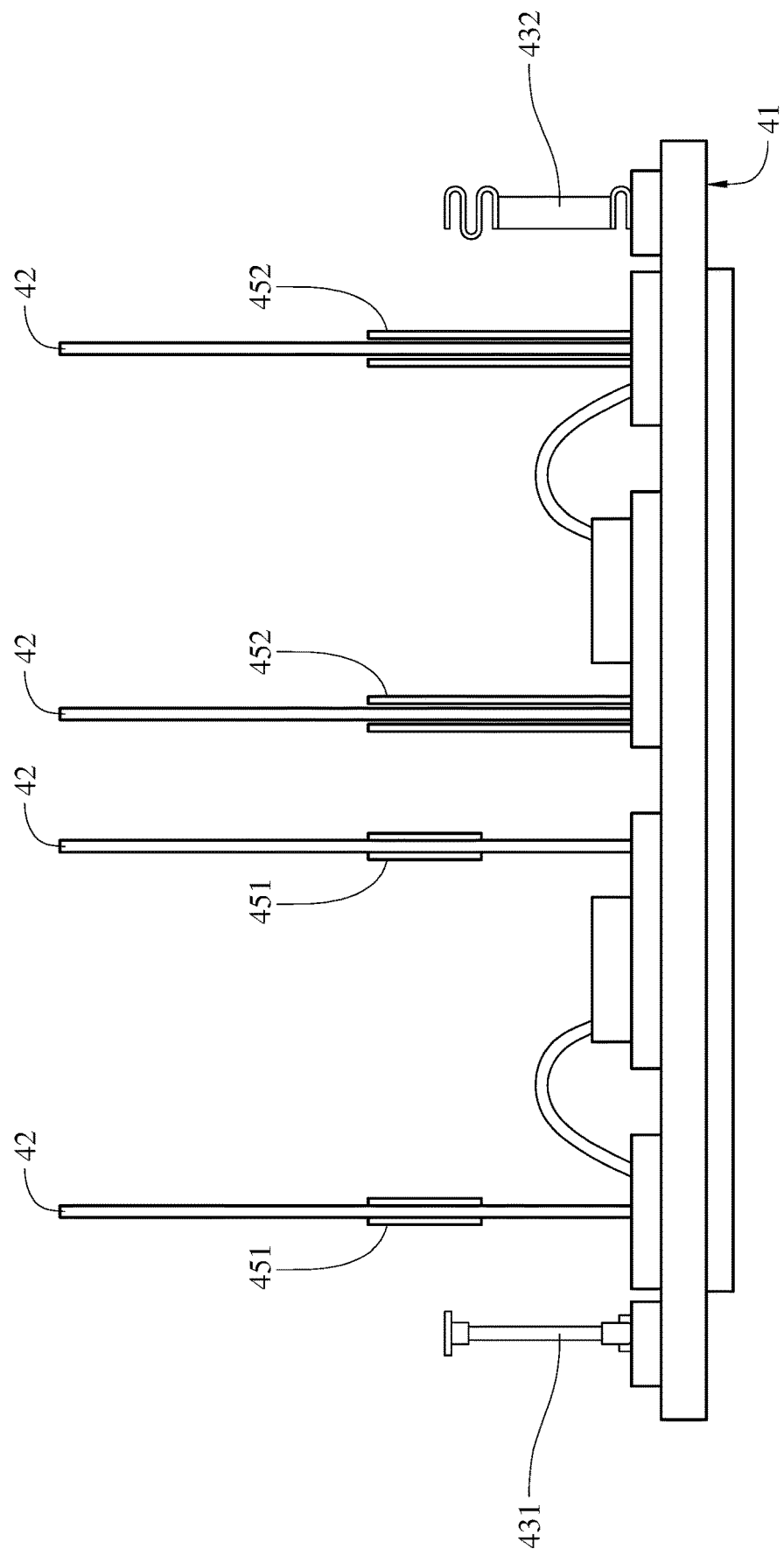
FIG. 12 is a schematic cross-sectional view of a manufacturing process of the power module in FIG. 11.
Figure 13:
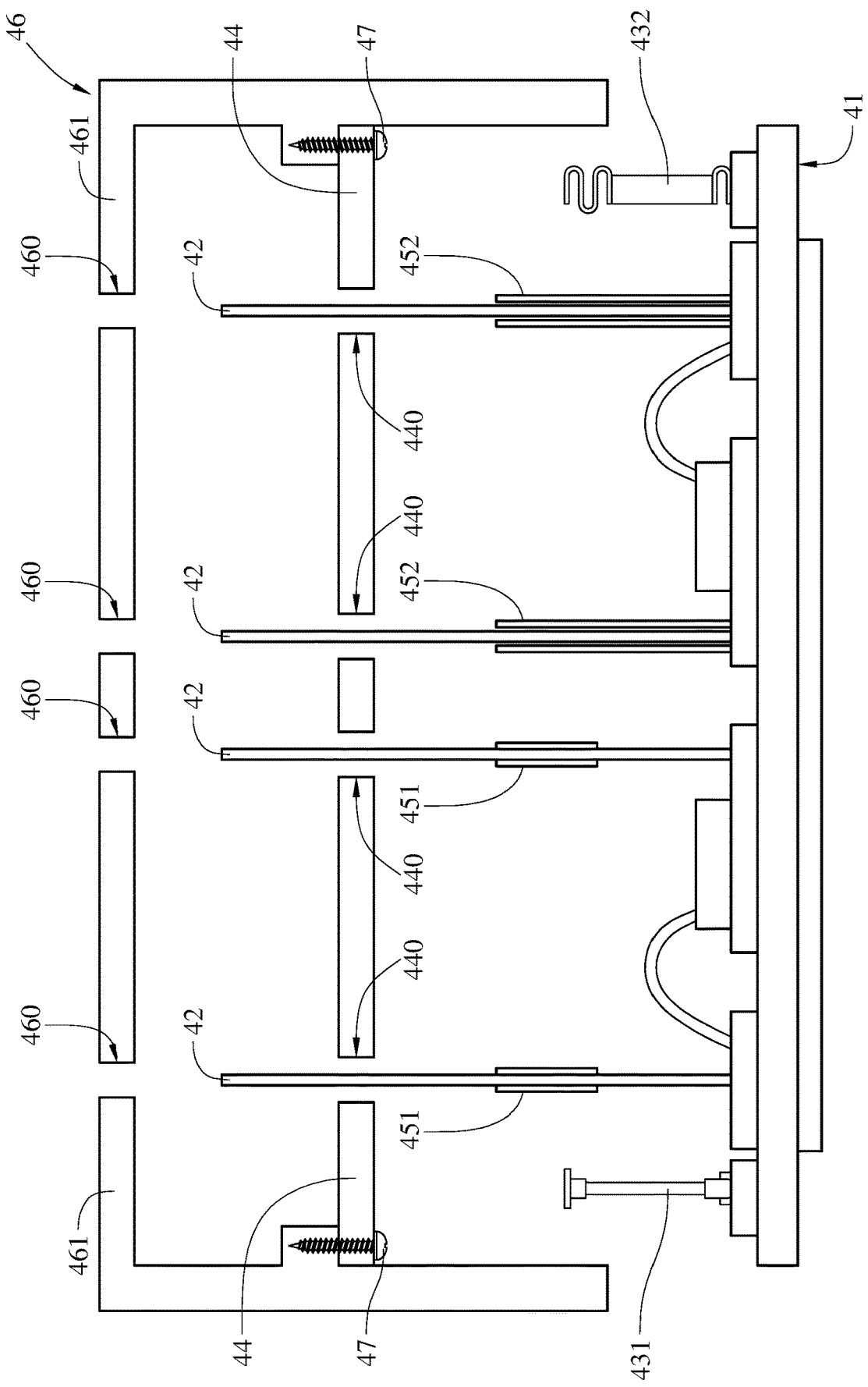
FIG. 13 is a schematic cross-sectional view of the manufacturing process of the power module in FIG. 11.

As shown in FIG. 12 and FIG. 13, a manufacturing process of the power module 4 in FIG. 11 is described. As shown in FIG. 12, the power circuit board 41 is provided. The signal pins 42, the first ground pin 431, and the second ground pin 432 are disposed and stand on the power circuit board 41. The electrically insulating components 451 are respectively sleeved on some of the signal pins 42, and the electrically insulating components 452 are respectively sleeved on other some of the signal pins 42. The electrically insulating components 451 may be thermal-shrinkable sleeves. After the electrically insulating components 451 are respectively sleeved on the signal pins 42, hot air may be blown to the electrically insulating components 451, so that each of the electrically insulating components 451 is tightly attached to each of the signal pins 42 due to thermal shrinkage.

As shown in FIG. 13, the cover body 46 is provided. The top plate 461 of the cover body 46 has the plurality of the third through holes 460. The shielding substrate 44 is provided. The shielding substrate 44 has the plurality of the first through holes 440. The fixing components 47 are used to fix the shielding substrate 44 to the cover body 46. The shielding substrate 44 is located under the top plate 461. The shielding substrate 44 and the cover body 46 cover the power circuit board 41. The signal pins 42 are respectively aligned with the first through holes 440 of the shielding substrate 44 and respectively aligned with the third through holes 460 of the top plate 461 of the cover body 46. The electrically insulating components 451 and the signal pins 42 on which the electrically insulating components 451 are respectively sleeved are together disposed through some of the first through holes 440. The electrically insulating components 452 and the signal pins 42 on which the electrically insulating components 452 are respectively sleeved are together disposed through the other of the first through holes 440. The signal pins 42 are further respectively disposed through the third through holes 460. Thereby, the manufacture of the power module 4 shown in FIG. 11 is completed.

Figure 14:
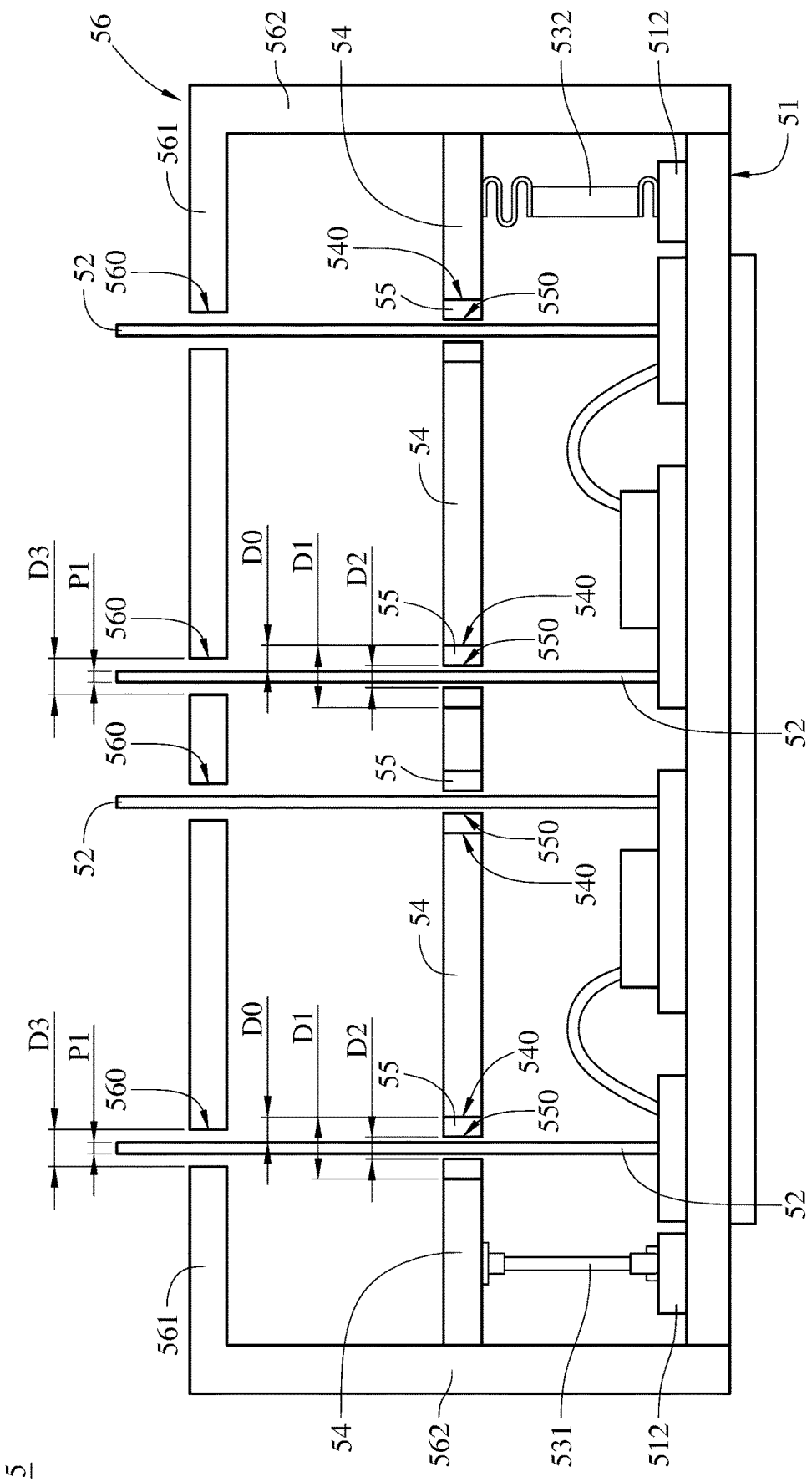
FIG. 14 is a schematic cross-sectional view of a power module according to another embodiment of the disclosure.

Please refer to FIG. 14. FIG. 14 is a schematic cross-sectional view of a power module 5 according to another embodiment of the disclosure. The power module 5 shown in FIG. 14 is similar to the power module 1 shown in FIG. 1 in structure. As shown in FIG. 14, the power module 5 includes a power circuit board 51, a plurality of signal pins 52, a first ground pin 531, a second ground pin 532, a shielding substrate 54, a plurality of electrically insulating components 55, and a cover body 56.

The signal pins 52, the first ground pin 531, and the second ground pin 532 are disposed and stand on the power circuit board 51. The first ground pin 531 and the second ground pin 532 are respectively disposed and stand on a plurality of ground pads 512 of the power circuit board 51 and are respectively electrically connected to the ground pads 512.

The shielding substrate 54 has a plurality of first through holes 540. The electrically insulating components 55 are fixed to the shielding substrate 54 and respectively located in the first through holes 540. Each of the electrically insulating components 55 has a second through hole 550. The signal pins 52 are respectively disposed through the second through holes 550 and also respectively disposed through the first through holes 540. The electrically insulating components 55 respectively correspond to and surround the signal pins 52. Each of the signal pins 52 is spaced apart from the shielding substrate 54 by a distance DO by the electrically insulating components 55. Especially, each of the signal pins 52 is electrically insulated from the shielding substrate 54 by the electrically insulating components 55. A hole diameter D2 of each of the second through holes 550 is greater than an outer diameter P1 of each of the signal pins 52.

The shielding substrate 54 is located above and fixed to the first ground pin 531. By the first ground pin 531, the shielding substrate 54 is located above the power circuit board 51 and spaced apart from the power circuit board 51. The first ground pin 531 is electrically connected to the shielding substrate 54 and one of the ground pads 512 of the power circuit board 51. The second ground pin 532 is in contact with the shielding substrate 54. The second ground pin 532 is electrically connected to the shielding substrate 54 and one of the ground pads 512 of the power circuit board 51.

The cover body 56 includes a top plate 561 and a side wall 562. The side wall 562 surrounds the top plate 561. The cover body 56 covers the power circuit board 51 and the shielding substrate 54. The side wall 562 of the cover body 56 further surrounds the power circuit board 51 and the shielding substrate 54. The top plate 561 of the cover body 56 is located above the shielding substrate 54. The top plate 561 of the cover body 56 has a plurality of third through holes 560. The signal pins 52 are respectively disposed through the third through holes 560. A hole diameter D3 of each of the third through holes 560 is greater than the outer diameter P1 of each of the signal pins 52.

Figure 15:
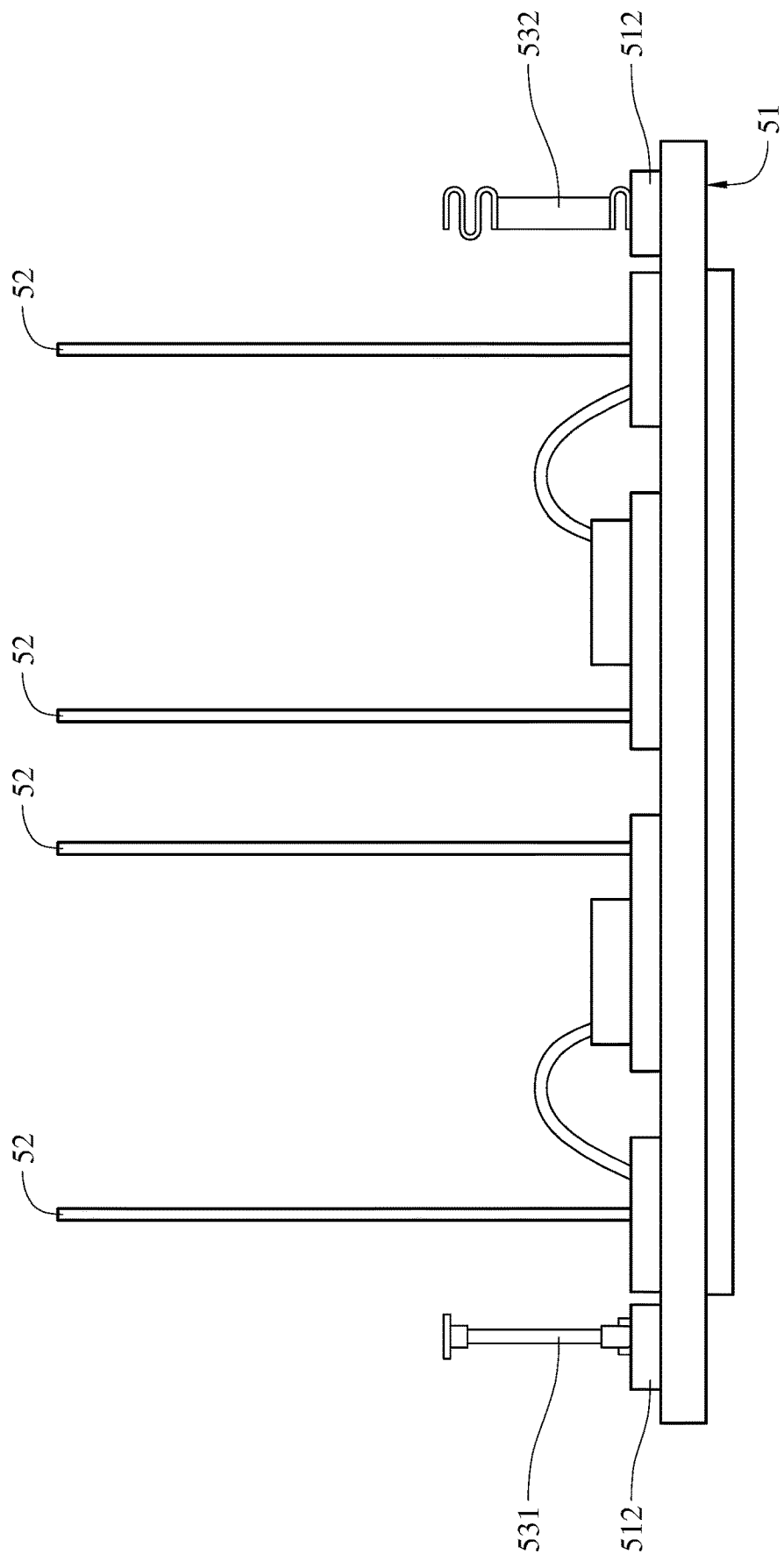
FIG. 15 is a schematic cross-sectional view of a manufacturing process of the power module in FIG. 14.
Figure 16:
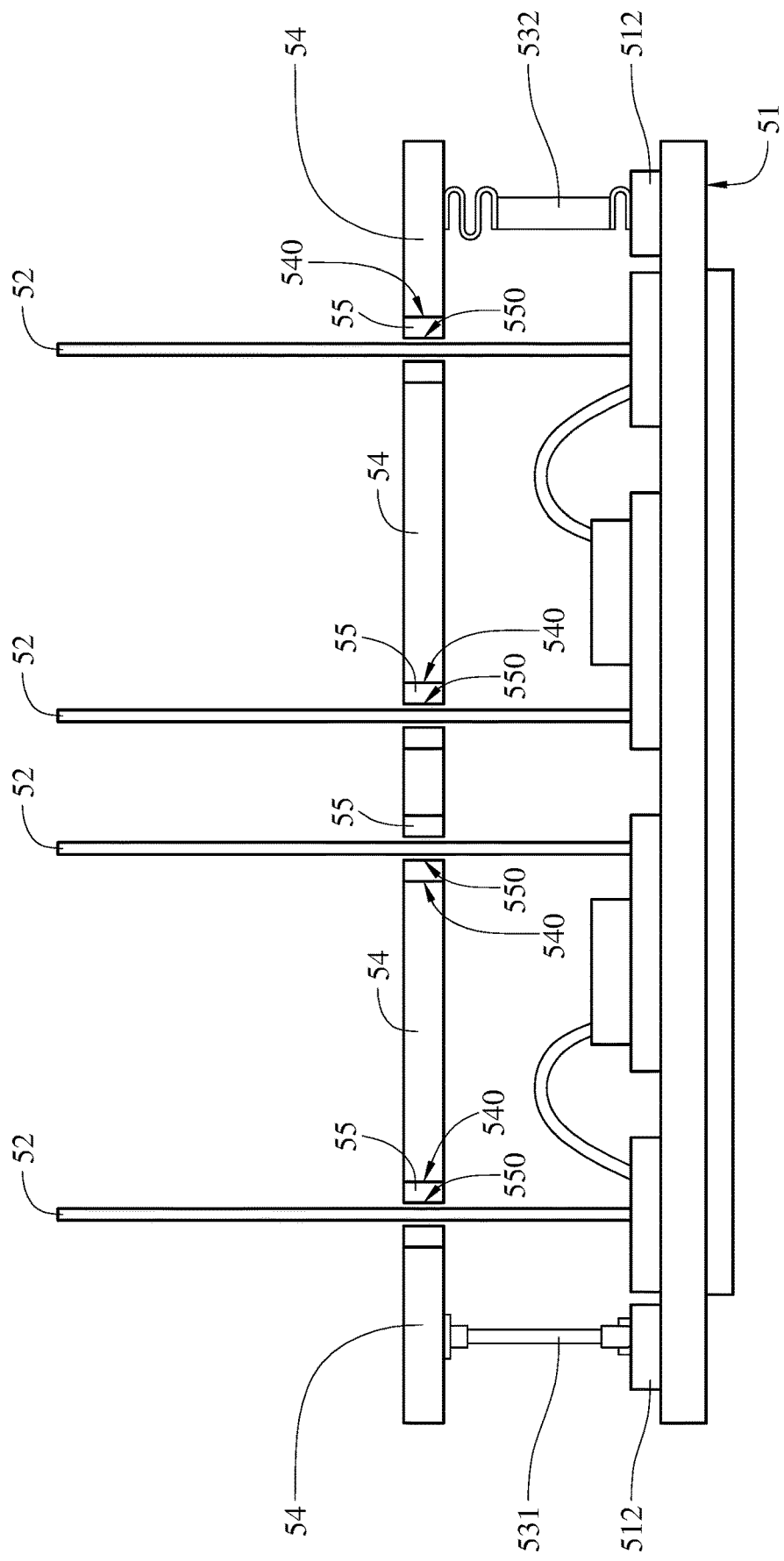
FIG. 16 is a schematic cross-sectional view of the manufacturing process of the power module in FIG. 14.
Figure 17:
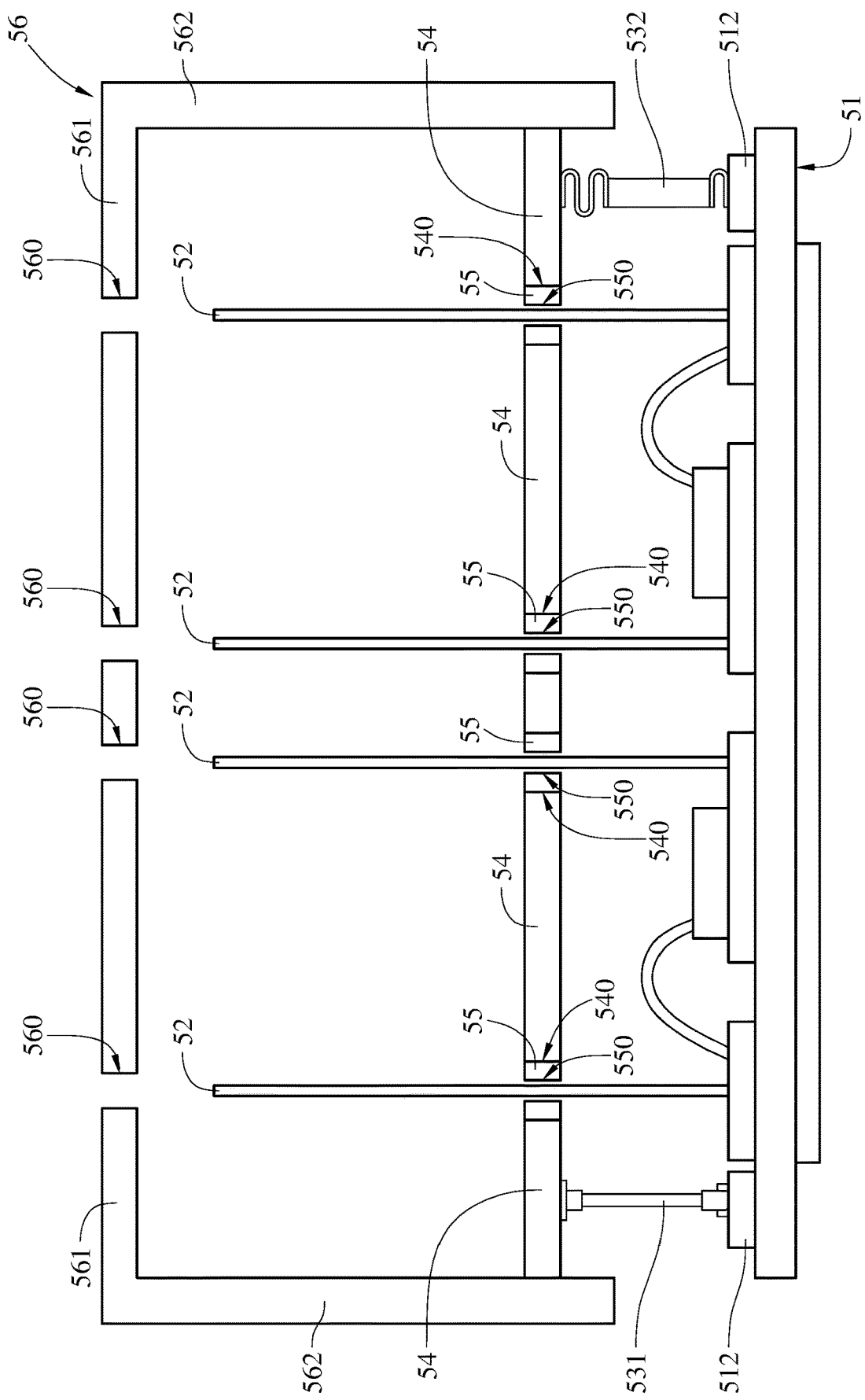
FIG. 17 is a schematic cross-sectional view of the manufacturing process of the power module in FIG. 14.

As shown in FIG. 15 to FIG. 17, a manufacturing process of the power module 5 in FIG. 14 is described. As shown in FIG. 15, the power circuit board 51 is provided. The signal pins 52, the first ground pin 531, and the second ground pin 532 are disposed and stand on the power circuit board 51.

As shown in FIG. 16, the shielding substrate 54 is provided. The shielding substrate 54 has the plurality of the first through holes 540. The electrically insulating components 55 are fixed to the shielding substrate 54 and respectively located in the first through holes 540. Each of the electrically insulating components 55 has a second through hole 550.

The shielding substrate 54 is placed above the first ground pin 531 and then fixed to the first ground pin 531. The signal pins 52 are respectively aligned with the second through holes 550 of the electrically insulating components 55 and respectively disposed through the second through holes 550. The first ground pin 531 is electrically connected to the shielding substrate 54 and one of the ground pads 512 of the power circuit board 51. The second ground pin 532 is electrically connected to the shielding substrate 54 and one of the ground pads 512 of the power circuit board 51.

As shown in FIG. 17, the cover body 56 is provided. The top plate 561 of the cover body 56 has the plurality of the third through holes 560. The side wall 562 surrounds the top plate 561. The cover body 56 covers the power circuit board 51 and the shielding substrate 54, so that the side wall 562 of the cover body 56 surrounds the power circuit board 51 and the shielding substrate 54, and the top plate 561 of the cover body 56 is located above the shielding substrate 54. The signal pins 52 are respectively aligned with the third through holes 560 of the top plate 561 of the cover body 56. The signal pins 52 are respectively disposed through the third through holes 560. Thereby, the manufacture of the power module 5 shown in FIG. 14 is completed.

Figure 18:
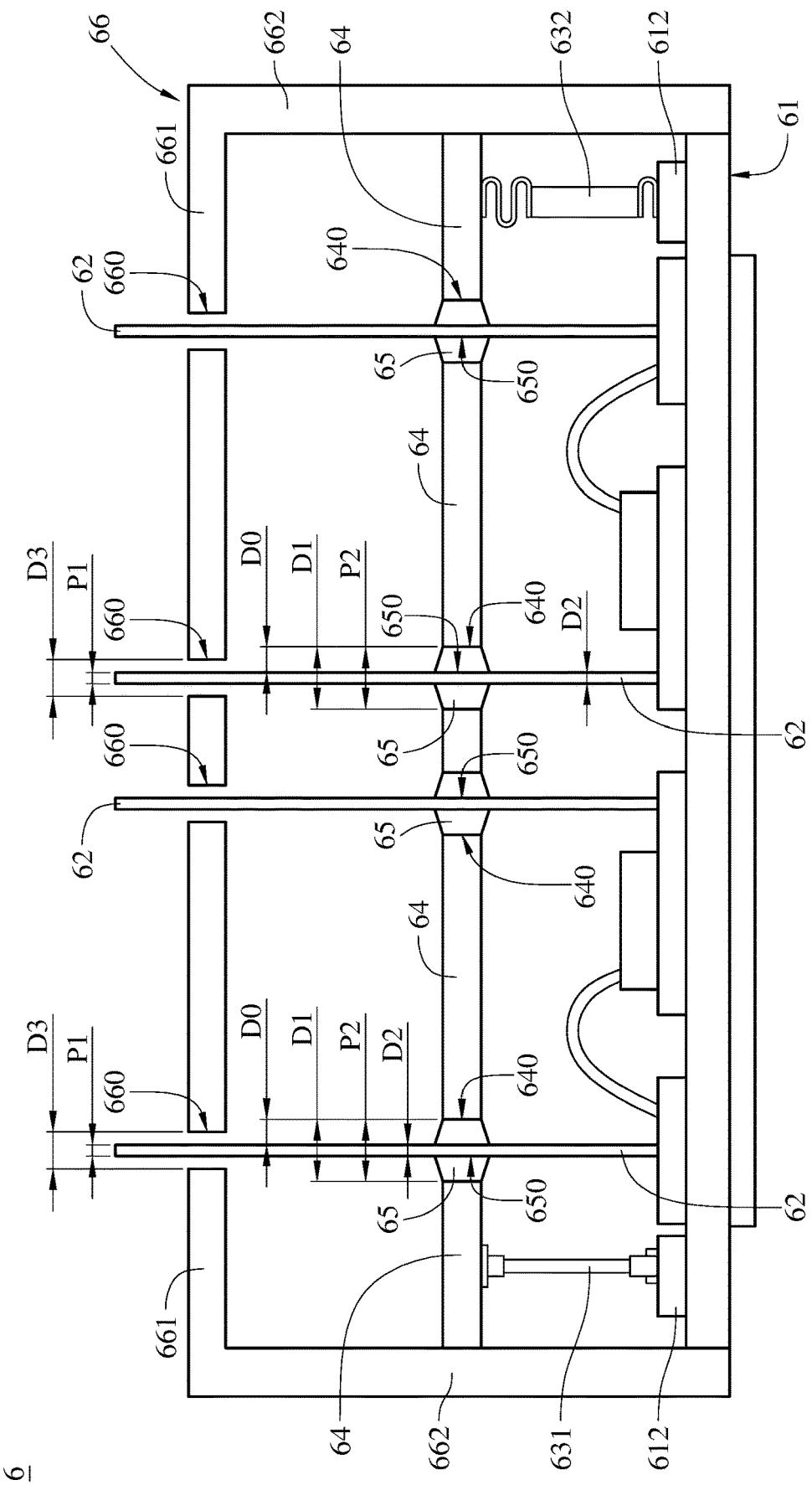
FIG. 18 is a schematic cross-sectional view of a power module according to another embodiment of the disclosure.

Please refer to FIG. 18. FIG. 18 is a schematic cross-sectional view of a power module 6 according to another embodiment of the disclosure. The power module 6 shown in FIG. 18 is similar to the power module 5 shown in FIG. 14 in structure. As shown in FIG. 18, the power module 6 includes a power circuit board 61, a plurality of signal pins 62, a first ground pin 631, a second ground pin 632, a shielding substrate 64, a plurality of electrically insulating components 65, and a cover body 66.

The signal pins 62, the first ground pin 631, and the second ground pin 632 are disposed and stand on the power circuit board 61. The first ground pin 631 and the second ground pin 632 are respectively disposed and stand on a plurality of ground pads 612 of the power circuit board 61 and are respectively electrically connected to the ground pads 612.

The shielding substrate 64 has a plurality of first through holes 640. The signal pins 62 are respectively disposed through the first through holes 640. The shielding substrate 64 is located above and fixed to the first ground pin 631. By the first ground pin 631, the shielding substrate 64 is located above the power circuit board 61 and spaced apart from the power circuit board 61. The first ground pin 631 is electrically connected to the shielding substrate 64 and one of the ground pads 612 of the power circuit board 61. The second ground pin 632 is in contact with the shielding substrate 64. The second ground pin 632 is electrically connected to the shielding substrate 64 and one of the ground pads 612 of the power circuit board 61.

The electrically insulating components 65 are respectively disposed in the first through holes 640 of the shielding substrate 64 and respectively correspond to and surround the signal pins 62. Thereby, the signal pins 62 are respectively disposed through the second through holes 650. Each of the signal pins 62 is spaced apart from the shielding substrate 64 by a distance D0 by the electrically insulating components 65. Especially, each of the signal pins 62 is electrically insulated from the shielding substrate 64 by the electrically insulating components 65. A hole diameter D2 of each of the second through holes 650 is substantially equal to an outer diameter P1 of each of the signal pins 62. A hole diameter D1 of each of the first through holes 640 is substantially equal to an outer diameter P2 of each of the electrically insulating components 65.

The cover body 66 includes a top plate 661 and a side wall 662. The side wall 662 surrounds the top plate 661. The cover body 66 covers the power circuit board 61 and the shielding substrate 64. The side wall 662 of the cover body 66 further surrounds the power circuit board 61 and the shielding substrate 64. The top plate 661 of the cover body 66 is located above the shielding substrate 64. The top plate 661 of the cover body 66 has a plurality of third through holes 660. The signal pins 62 are respectively disposed through the third through holes 660. A hole diameter D3 of each of the third through holes 660 is greater than the outer diameter P1 of each of the signal pins 62.

Figure 19:
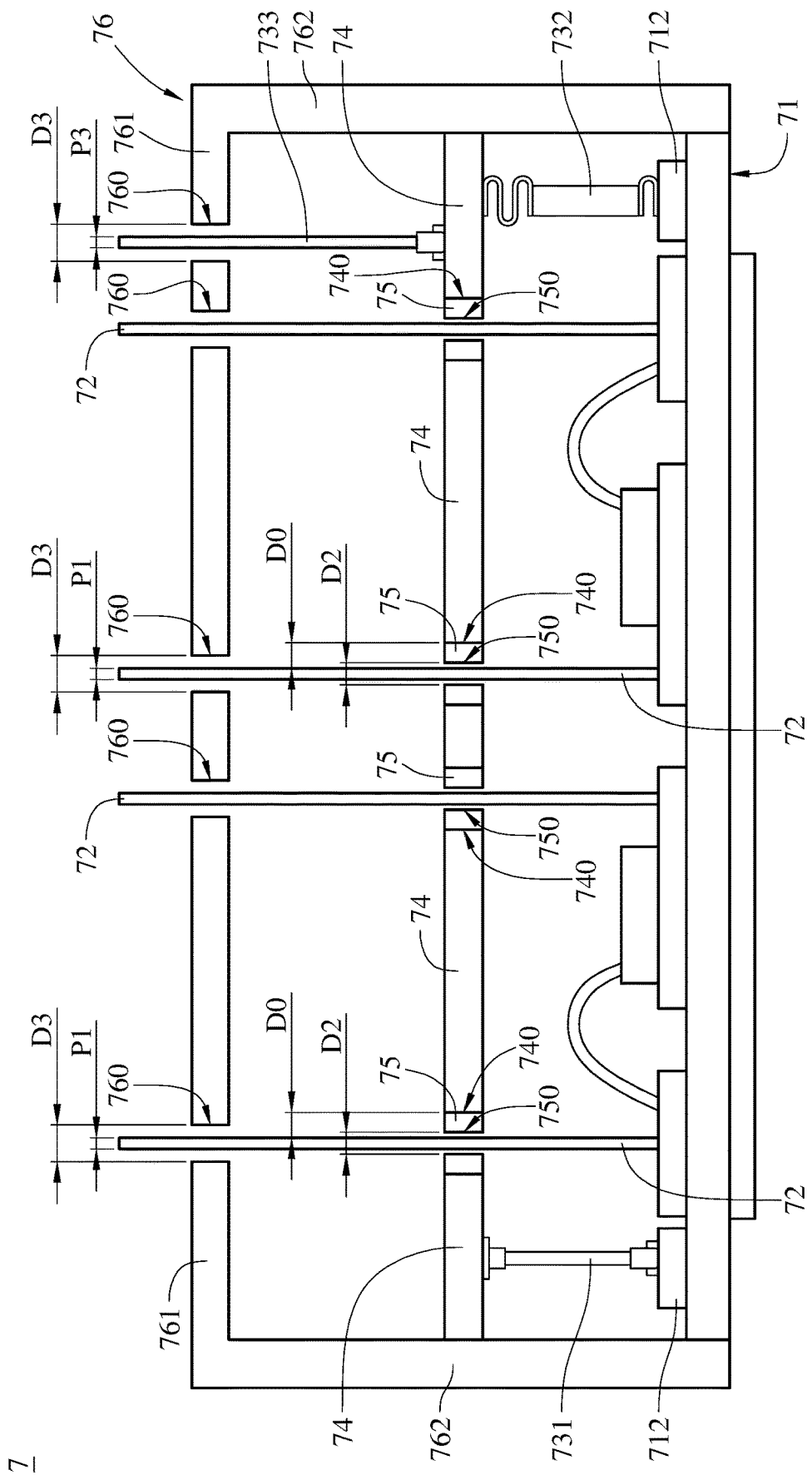
FIG. 19 is a schematic cross-sectional view of a power module according to another embodiment of the disclosure.

Please refer to FIG. 19. FIG. 19 is a schematic cross-sectional view of a power module 7 according to another embodiment of the disclosure. The power module 7 shown in FIG. 19 is similar to the power module 1 shown in FIG. 1 in structure. As shown in FIG. 17, the power module 7 includes a power circuit board 71, a plurality of signal pins 72, a first ground pin 731, a second ground pin 732, a third ground pin 733, a shielding substrate 74, a plurality of electrically insulating components 75, and a cover body 76.

The signal pins 72, the first ground pin 731, and the second ground pin 732 are disposed and stand on the power circuit board 71. The first ground pin 731 and the second ground pin 732 are respectively disposed and stand on a plurality of the ground pads 712 of the power circuit board 71 and are respectively electrically connected to the ground pads 712.

The shielding substrate 74 has a plurality of first through holes 740. The electrically insulating components 75 are fixed to the shielding substrate 74 and respectively located in the first through holes 740. Each of the electrically insulating components 75 has a second through hole 750. The signal pins 72 are respectively disposed through the second through holes 750 and also respectively disposed through the first through holes 740. The electrically insulating components 75 respectively correspond to and surround the signal pins 72. Each of the signal pins 72 is spaced apart from the shielding substrate 74 by a distance D0 by the electrically insulating components 75. Especially, each of the signal pins 72 is electrically insulated from the shielding substrate 74 by the electrically insulating components 75. A hole diameter D2 of each of the second through holes 750 is greater than an outer diameter P1 of each of the signal pins 72.

The shielding substrate 74 is located above and fixed to the first ground pin 731. By the first ground pin 731, the shielding substrate 74 is located above the power circuit board 71 and spaced apart from the power circuit board 71. The first ground pin 731 is electrically connected to the shielding substrate 74 and one of the ground pads 712 of the power circuit board 71. The second ground pin 732 is in contact with the shielding substrate 74. The second ground pin 732 is electrically connected to the shielding substrate 74 and one of the ground pads 712 of the power circuit board 71. The third ground pin 733 is disposed and stands on the shielding substrate 74, and the third ground pin 733 is located above the shielding substrate 74. The first ground pin 731 and the second ground pin 732 are located under the shielding substrate 74.

The cover body 76 includes a top plate 761 and a side wall 762. The side wall 762 surrounds the top plate 761. The cover body 76 covers the power circuit board 71 and the shielding substrate 74. The side wall 762 of the cover body 76 further surrounds the power circuit board 71 and the shielding substrate 74. The top plate 761 of the cover body 76 is located above the shielding substrate 74. The top plate 761 of the cover body 76 has a plurality of third through holes 760. The quantity of the third through holes 760 is greater than the quantity of signal pins 72. The third ground pin 733 and the signal pins 72 are respectively disposed through the third through holes 760. A hole diameter D3 of each of the third through holes 760 is greater than the outer diameter P1 of each of the signal pins 72, and the hole diameter D3 of each of the third through holes 760 is also greater than an outer diameter P3 of the third ground pin 733.

According to the power modules as discussed in the above embodiments of the disclosure, by grounding the shielding substrate, the shielding substrate provides an electromagnetic interference shielding effect, and the electromagnetic wave generated by the power chips of the power circuit board does not easily leak out of the cover body. Additionally, the electrical insulation between the signal pins and the shielding substrate is ensured by the electrically insulating component.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A power module, comprising:
    a power circuit board;
    a signal pin, disposed and standing on the power circuit board;
    a shielding substrate, located above the power circuit board and spaced apart from the power circuit board, wherein the shielding substrate has a first through hole, and the signal pin is disposed through the first through hole;
    an electrically insulating component, surrounding the signal pin, wherein the electrically insulating component has a second through hole, the signal pin is disposed through the second through hole, and the signal pin is spaced apart from the shielding substrate by a distance by the electrically insulating component, and
    a ground pin, wherein the power circuit board comprises a ground pad, the ground pin is disposed and stands on the power circuit board and in contact with the shielding substrate, and the ground pin is electrically connected to the ground pad of the power circuit board and the shielding substrate.

2. The power module according to claim 1, wherein the electrically insulating component is fixed to the shielding substrate and located in the first through hole, and a hole diameter of the second through hole is greater than an outer diameter of the signal pin.

3. The power module according to claim 1, wherein the shielding substrate comprises a core layer and a lower electrically conductive layer, the lower electrically conductive layer is disposed on a side of the core layer located closer to the power circuit board, the electrically insulating component and the core layer of the shielding substrate are integrated in one piece, and a hole diameter of the second through hole is greater than an outer diameter of the signal pin.

4. The power module according to claim 1, wherein a shape of the electrically insulating component is a sleeve, the electrically insulating component is sleeved on the signal pin, a hole diameter of the second through hole is substantially equal to an outer diameter of the signal pin, and a hole diameter of the first through hole is greater than an outer diameter of the electrically insulating component.

5. The power module according to claim 1, wherein a shape of the electrically insulating component is a sleeve, the electrically insulating component is sleeved on the signal pin, a hole diameter of the second through hole is greater than an outer diameter of the signal pin, and a hole diameter of the first through hole is greater than an outer diameter of the electrically insulating component.

6. The power module according to claim 1, wherein the electrically insulating component is disposed in the first through hole and surrounds the signal pin, a hole diameter of the second through hole is substantially equal to an outer diameter of the signal pin, and a hole diameter of the first through hole is substantially equal to an outer diameter of the electrically insulating component.

7. The power module according to claim 1, further comprising a cover body covering the power circuit board and the shielding substrate, wherein the cover body has a third through hole, the signal pin is disposed through the third through hole, and a hole diameter of the third through hole is greater than an outer diameter of the signal pin.

8. The power module according to claim 1, further comprising a filling glue disposed between the power circuit board and the shielding substrate.

9. The power module according to claim 3, wherein the shielding substrate further comprises an upper electrically conductive layer, and the upper electrically conductive layer is disposed on a side of the core layer located farther away from the power circuit board.

10. The power module according to claim 7, further comprising a fixing component, wherein the cover body has a protrusion, and the shielding substrate is fixed to the protrusion of the cover body by the fixing component.

11. The power module according to claim 7, further comprising a ground pin disposed and standing on the shielding substrate and disposed through the third through hole of the cover body.

* * * * *